(12) United States Patent
Hudson et al.

(10) Patent No.: US 11,673,352 B2
(45) Date of Patent: Jun. 13, 2023

(54) AUTOMATED WAVE GUIDE SYSTEM FOR IN-PROCESS MONITORING OF CARBON FIBER REINFORCED POLYMER (CFRP) COMPOSITE LAMINATES WITH HANNING WINDOW TONE-BURSTS OF CENTER FREQUENCIES FROM 100-225 KHZ AND 100-350 KHZ

(71) Applicant: U.S.A. AS REPRESENTED BY THE ADMINISTRATOR OF THE NASA, Washington, DC (US)

(72) Inventors: Tyler B. Hudson, Suffolk, VA (US); Fuh-Gwo Yuan, Cary, NC (US); Brian W. Grimsley, Williamsburg, VA (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 515 days.

(21) Appl. No.: 15/710,211

(22) Filed: Sep. 20, 2017

(65) Prior Publication Data
US 2018/0079155 A1    Mar. 22, 2018

Related U.S. Application Data

(60) Provisional application No. 62/397,180, filed on Sep. 20, 2016, provisional application No. 62/442,708, filed on Jan. 5, 2017.

(51) Int. Cl.
*B29C 70/54* (2006.01)
*B29C 70/08* (2006.01)
(Continued)

(52) U.S. Cl.
CPC ........ *B29C 70/549* (2021.05); *B29C 35/0288* (2013.01); *B29C 70/08* (2013.01);
(Continued)

(58) Field of Classification Search
CPC ....... B29C 70/546; B29C 70/44; B29C 70/54; B29C 35/0288; B29C 70/528;
(Continued)

(56) References Cited

U.S. PATENT DOCUMENTS 3,716,869 A * 2/1973 Gould, Jr. ............... H01Q 1/00
343/779
4,455,268 A * 6/1984 Hinrichs ............. B29C 35/0288
264/494

(Continued)

FOREIGN PATENT DOCUMENTS

CN         103288268   *  9/2013
EP         1508420 A2  *  2/2005  ............. B29C 33/06
(Continued)

OTHER PUBLICATIONS

F. Lionetto, "Monitoring the Cure State of Thermosetting Resins by Ultrasound" Materials 2013, 6, 3783-3804. (Year: 2013).*

(Continued)

*Primary Examiner* — Joseph S Del Sole
*Assistant Examiner* — Guy F Mongelli
(74) *Attorney, Agent, or Firm* — Jennifer L. Riley; Robin W. Edwards; Trenton J. Roche

(57) ABSTRACT

A method of monitoring a curing process for fiber reinforced composite materials that includes positioning an actuator on uncured composite material at a first location. At least one sensor is positioned at a second location that is spaced apart from the first location. The actuator excites waves in the composite part at the first location. At least one sensor is positioned at a second location that is spaced apart from the first location. The actuator excites waves in the composite part at the first location. The waves propagate through the composite part due to internal reflection. At least one wave metric is measured at the second location utilizing the (Continued)

sensor. At least one parameter of the curing process may be adjusted based, at least in part, on a wave metric measured by the sensor.

18 Claims, 12 Drawing Sheets
(3 of 12 Drawing Sheet(s) Filed in Color)

(51) Int. Cl.
  B29C 70/88 (2006.01)
  B29C 70/34 (2006.01)
  H01L 41/08 (2006.01)
  B29C 70/52 (2006.01)
  B29C 35/02 (2006.01)
  B29C 70/44 (2006.01)
  H10N 30/00 (2023.01)
(52) U.S. Cl.
  CPC ............ B29C 70/342 (2013.01); B29C 70/44 (2013.01); B29C 70/528 (2013.01); B29C 70/546 (2013.01); B29C 70/88 (2013.01); H10N 30/1061 (2023.02); H10N 30/1071 (2023.02); B29C 35/0261 (2013.01)
(58) Field of Classification Search
  CPC ....... B29C 70/342; B29C 70/88; B29C 70/08; B29C 35/0261; H01L 41/0825; H01L 41/082
  See application file for complete search history.

(56) References Cited

U.S. PATENT DOCUMENTS

| | | | | |
|---|---|---|---|---|
| 4,515,545 A * | 5/1985 | Hinrichs | ................. | B29C 35/02 425/149 |
| 4,559,810 A * | 12/1985 | Hinrichs | ................. | B01J 3/002 73/54.41 |
| 4,568,848 A * | 2/1986 | Ogawa | ................. | H01L 41/187 252/62.9 PZ |
| 4,758,803 A * | 7/1988 | Thomas, III | ........... | G01N 29/12 331/65 |
| 4,779,452 A * | 10/1988 | Cohen-Tenoudji | .... | G01N 11/00 73/54.41 |
| 4,794,545 A * | 12/1988 | Salvado | ................. | G01N 29/07 702/30 |
| 4,806,292 A * | 2/1989 | DeLacy | ............... | G01N 33/442 264/237 |
| 4,824,117 A * | 4/1989 | Russell | ............... | A63F 3/00006 273/248 |
| 4,897,796 A * | 1/1990 | Salvado | ................. | G01N 29/07 702/30 |
| 4,921,415 A * | 5/1990 | Thomas, III | ........... | B06B 1/067 264/407 |
| 5,009,102 A * | 4/1991 | Afromowitz | ...... | G01N 21/4133 73/590 |
| 5,009,104 A * | 4/1991 | Johnson | ................. | G01N 29/11 264/257 |
| 5,031,457 A * | 7/1991 | Kline | ..................... | G01N 29/07 73/588 |
| 5,095,442 A * | 3/1992 | Salvado | ................. | G01N 29/07 702/30 |
| 5,127,268 A * | 7/1992 | Kline | ..................... | G01N 29/07 73/597 |
| 5,181,421 A * | 1/1993 | Kline | ..................... | G01N 29/07 73/597 |
| 5,210,499 A * | 5/1993 | Walsh | ..................... | G01N 27/07 324/649 |
| 5,345,397 A * | 9/1994 | Handel | ............... | B29C 35/0288 264/234 |
| 5,486,319 A * | 1/1996 | Stone | ................. | B29C 35/0288 264/315 |
| 5,766,395 A * | 6/1998 | Bainbridge | .............. | B27N 5/00 156/222 |
| 5,888,645 A * | 3/1999 | Lindgaard | ........... | B29C 35/0261 428/324 |
| 5,911,159 A * | 6/1999 | Choo | .................. | B29C 35/0288 73/590 |
| 6,441,616 B1 * | 8/2002 | Mansfield | .......... | G01R 33/3854 324/318 |
| 6,675,112 B1 * | 1/2004 | Chadwick | ................ | G01N 3/32 702/56 |
| 8,508,101 B2 * | 8/2013 | Yamanouchi | ....... | H03H 9/02102 310/313 A |
| 9,002,022 B1 * | 4/2015 | Clemen, Jr. | ............. | H04R 29/00 310/334 |
| 9,152,744 B2 * | 10/2015 | Grellou | .................. | G06F 30/20 |
| 9,533,453 B2 * | 1/2017 | Zuardy | ............... | G01D 5/35358 |
| 9,550,330 B2 * | 1/2017 | Pratte | .................... | B29C 70/086 |
| 9,645,095 B2 * | 5/2017 | Engelbart | ......... | G05B 19/41875 |
| 9,675,990 B2 * | 6/2017 | Ellis | ...................... | G01N 27/90 |
| 2002/0000125 A1 * | 1/2002 | Beardmore | ............ | G01N 29/07 73/598 |
| 2002/0103081 A1 * | 8/2002 | Wolff | ................. | B01D 39/2062 502/413 |
| 2004/0126579 A1 * | 7/2004 | Creagan | .................... | D01F 8/04 428/373 |
| 2004/0183738 A1 * | 9/2004 | Amano | ............. | H01Q 13/0283 343/786 |
| 2005/0146076 A1 * | 7/2005 | Alexander | ........... | D03D 1/0088 264/257 |
| 2005/0173820 A1 * | 8/2005 | Schneider | ............ | B29C 35/0288 264/236 |
| 2005/0212869 A1 * | 9/2005 | Ellson | .................... | B01L 3/0268 347/75 |
| 2005/0253309 A1 * | 11/2005 | Hou | ........................ | B29C 35/02 264/571 |
| 2006/0123914 A1 * | 6/2006 | Pena | .................... | B29C 35/0288 73/629 |
| 2008/0208054 A1 * | 8/2008 | Azuma | .................. | A61B 8/463 600/443 |
| 2008/0315462 A1 * | 12/2008 | Batzinger | .............. | G01B 17/02 264/407 |
| 2009/0012203 A1 * | 1/2009 | Nakanishi | ............. | C08G 59/063 522/135 |
| 2009/0218118 A1 * | 9/2009 | Tani | .................... | H01L 23/5389 174/256 |
| 2009/0275689 A1 * | 11/2009 | Isayev | ....................... | B29B 7/42 524/495 |
| 2009/0301198 A1 * | 12/2009 | Sohn | .................... | G01N 29/348 73/598 |
| 2009/0314088 A1 * | 12/2009 | Djordjevic | ........... | G01N 29/028 73/602 |
| 2010/0092780 A1 * | 4/2010 | Morinaga | .................. | C08J 7/02 428/411.1 |
| 2010/0107760 A1 * | 5/2010 | Murashima | ........ | G01C 19/5607 73/504.12 |
| 2010/0107768 A1 * | 5/2010 | Elze | ..................... | G01N 29/043 73/627 |
| 2010/0181018 A1 * | 7/2010 | Walczyk | ................. | B29C 70/44 156/243 |
| 2010/0186495 A1 * | 7/2010 | Bekkeheien | .......... | E21B 49/008 73/152.22 |
| 2011/0308259 A1 * | 12/2011 | Wray | ....................... | F16L 55/103 62/3.3 |
| 2012/0326347 A1 * | 12/2012 | Rose | .................... | B29C 35/0288 264/40.1 |
| 2014/0270320 A1 * | 9/2014 | O'Polka | ................. | H04R 1/026 381/386 |
| 2015/0030389 A1 * | 1/2015 | Pollett | .................. | B29C 70/545 403/404 |
| 2015/0060437 A1 * | 3/2015 | Karch | .................... | H05B 6/105 219/634 |
| 2015/0133016 A1 * | 5/2015 | Bremmer | .................. | B32B 5/12 442/181 |
| 2015/0192672 A1 * | 7/2015 | Doherty | ................. | G01S 15/06 367/88 |

(56) References Cited

U.S. PATENT DOCUMENTS

| | | | | |
|---|---|---|---|---|
| 2015/0268244 | A1* | 9/2015 | Cho | G01N 33/57492 |
| | | | | 435/7.23 |
| 2015/0367586 | A1* | 12/2015 | Georgeson | B29C 70/342 |
| | | | | 367/140 |
| 2015/0377839 | A1* | 12/2015 | Jack | G01N 29/4472 |
| | | | | 702/33 |
| 2016/0011088 | A1* | 1/2016 | Guthrie | G01N 29/045 |
| | | | | 73/12.13 |
| 2016/0039185 | A1* | 2/2016 | Kawabe | C08J 5/24 |
| | | | | 428/335 |
| 2016/0091388 | A1* | 3/2016 | De Baere | G01M 5/0033 |
| | | | | 73/40 |
| 2016/0103101 | A1* | 4/2016 | Clarkson | G01N 29/4427 |
| | | | | 73/588 |
| 2016/0153938 | A1* | 6/2016 | Balasubramaniam | |
| | | | | G01N 29/024 |
| | | | | 73/579 |
| 2016/0262727 | A1* | 9/2016 | Dayton | A61B 8/4477 |
| 2016/0280867 | A1* | 9/2016 | Nowak | C08J 3/241 |
| 2016/0339649 | A1* | 11/2016 | Rose | B29C 70/54 |
| 2016/0349213 | A1* | 12/2016 | Kollgaard | G01N 29/0645 |
| 2017/0100894 | A1* | 4/2017 | Burns | B29C 64/386 |
| 2018/0169794 | A1* | 6/2018 | Almuhammadi | B23K 26/60 |
| 2018/0328892 | A1* | 11/2018 | Tansel | G01N 29/262 |

FOREIGN PATENT DOCUMENTS

| | | | | |
|---|---|---|---|---|
| GB | 2502257 | A * | 11/2013 | B05C 11/00 |
| SE | 446571 | B * | 9/1986 | B29C 33/06 |
| WO | WO-2013093071 | A1 * | 6/2013 | B05C 11/00 |
| WO | WO-2015075147 | A1 * | 5/2015 | B29C 66/45 |

OTHER PUBLICATIONS https://web.archive.org/web/20160509195415/https://www.niar.wichita.edu/coe/ncamp_documents/Hexcel%208552/CAM-RP-2009-015%20Rev%20A%20April%2022%202011%20Hexcel%208552%20IM7%20Uni%20Data%20Report.pdf (Year: 2016).*

Investigating the Acoustical Properties of CFRP, Glass-Fiber- and Hemp Fiber-Reinforced Polyester Composites (https://onlinelibrary.wiley.com/doi/full/10.1002/pc.22872) (Year: 2014).*

SE-446571-B translation (Year: 2022).*
EP-1508420-A2 translation (Year: 2022).*
WO-2013093071-A1 translation (Year: 2022).*
GB-2502257-A (Year: 2022).*
WO-2015075147-A1 translation (Year: 2022).*

Hou, T. H. 2014. "Cure cycle design methodology for fabricating reactive resin matrix fiber reinforced composites: A protocol for producing void-free quality laminates," NASA TM 2014-218524: pp. 1-16.

Birt, E. and R. Smith. 2004. "A review of NDE methods for porosity measurement in fibre-reinforced polymer composites," Insight-Non-Destructive Testing and Condition Monitoring, 46: No. 11 pp. 681-686.

Lindrose A. M. 1978. "Ultrasonic wave and moduli changes in a curing epoxy resin," Experimental Mechanics, 18: pp. 227-232, Jun. 1978.

Speake, J., R. Arridge, and G. Curtis. 1974. "Measurement of the cure of resins by ultrasonic techniques," Journal of Physics D: Applied Physics, 7: pp. 412-424.

Adams, R. and P. Cawley. 1988. "A review of defect types and nondestructive testing techniques for composites and bonded joints," NDT International, 21: pp. 208-222.

Chen, J., S. Hoa, C. Jen, and H. Wang. 1999. "Fiber-optic and ultrasonic measurements for in-situ cure monitoring of graphite/epoxy composites," Journal of Composite Materials, 33: pp. 1860-1881.

Maffezzoli, A., E. Quarta, V. Luprano, G. Montagna, and L. Nicolais. 1999. "Cure monitoring of epoxy matrices for composites by ultrasonic wave propagation," Journal of Applied Polymer Science, 73: pp. 1969-1977.

Lionetto, F., A. Tarzia, and A. Maffezzoli. 2007. "Air-coupled ultrasound: a novel technique for monitoring the curing of thermosetting matrices," IEEE Transactions on Ultrasonics, Ferroelectrics and Frequency Control, 54: pp. 1437-1444.

Liebers, N., F. Raddatz, and F. SCHADOW. 2013. Effective and flexible ultrasound sensors for cure monitoring for industrial composite production. Deutsche Gesellschaft fur Luft-und Raumfahrt-Lilienthal-Oberth eV., pp. 1-6.

Stone, D. and B. Clarke. 1975. "Ultrasonic attenuation as a measure of void content in carbon-fibre reinforced plastics," Non-destructive Testing, 8: pp. 137-145.

Jeong, H. and D. Hsu. 1995. "Experimental analysis of porosity-induced ultrasonic attenuation and velocity change in carbon composites," Ultrasonics, 33: pp. 195-203.

Pavlopoulou, S., C. Soutis, and W. Staszewslo. 2012. "Cure monitoring through time-frequency analysis of guided ultrasonic waves," Plastics, Rubber and Composites, 41: pp. 180-186.

Hudson T. B., T. H. Hou, B. W. Grimsley, and F. G. Yuan. 2015. "Detection of CFRP composite manufacturing defects using a guided wave approach," Proceedings SAMPE Technical Conference, May 18-May 21, 2015, pp. 1-16.

Ee, D. V. and A. Poursartip 2009. "HexPly 8552 material properties database for use with COMPRO CCA and RAVEN," National Center for Advanced Materials Performance, pp. 1-141.

Farquharson S., J. Carignan, V. Khitrov, A. Senador, and M. Shaw. 2004. "Development of a phase diagram to control composite manufacturing using Raman spectroscopy," Proceedings SPIE 5272, Industrial and Highway Sensors Technology, Mar. 8, 2004, pp. 19-29.

Ersoy, N., K. Potter, M. R. Wisnom, and M. J. Clegg. 2005. "An experimental method to study the frictional processes during composites manufacturing," Composites Part A: Applied Science and Manufacturing, 36: pp. 1536-1544.

Ersoy, N., K. Potter, M. R. Wisnom, and M. J. Clegg. 2005. "Development of spring-in angle during cure of a thermosetting composite," Composites Part A: Applied Science and Manufacturing, 36: pp. 1700-1706.

Ersoy, N., T. Garstka L, K. Potter, M. R. Wisnom, D. Porter, M. Clegg, and G. Stringer. 2010. "Development of the properties of a carbon fibre reinforced thermosetting composite through cure," Composites Part A: Applied Science and Manufacturing, 41: pp. 401-409.

* cited by examiner

AUTOMATED WAVE GUIDE SYSTEM FOR IN-PROCESS MONITORING OF CARBON FIBER REINFORCED POLYMER (CFRP) COMPOSITE LAMINATES WITH HANNING WINDOW TONE-BURSTS OF CENTER FREQUENCIES FROM 100-225 KHZ AND 100-350 KHZ

CROSS-REFERENCE TO RELATED PATENT APPLICATION(S)

This patent application claims the benefit of and priority to U.S. Provisional Patent Application No. 62/397,180 filed on Sep. 20, 2016, titled, "Automated Wave Guide System for In-Process Monitoring of CFRP Composite Laminates," and to U.S. Provisional Patent Application No. 62/442,708 filed on Jan. 5, 2017, titled, "Automated Wave Guide System for In-Process Monitoring of CFRP Composite Laminates," the contents of each application is hereby incorporated by reference in its entirety.

STATEMENT REGARDING FEDERALLY SPONSORED RESEARCH OR DEVELOPMENT

The invention described herein was made in the performance of work under a NASA contract and by an employee of the United States Government and is subject to the provisions of Public Law 96-517 (35 U.S.C. § 202) and may be manufactured and used by or for the Government for governmental purposes without the payment of any royalties thereon or therefore. In accordance with 35 U.S.C. § 202, the contractor elected not to retain title.

BACKGROUND OF THE INVENTION

Known cure monitoring techniques include differential scanning calorimetry (DSC), rheology, dynamic mechanical analysis (DMA), and thermal gravimetric analysis (TGA). These material characterization techniques may be utilized to monitor thermo-physical and mechanical properties of a resin during cure. Typically, the techniques must be conducted on a small sample in a controlled laboratory instrument.

Another known cure monitoring technique, dielectric analysis (DEA), utilizes a loss factor, $\epsilon''$, to monitor the different phases of cure (e.g., in glass-fiber reinforced epoxy). The degree of cure measured from DEA correlates well with DSC and Raman spectroscopy for isothermal cure of in epoxy resins. During the resin transfer molding process, the maximum of the ionic conductivity indicated minimum viscosity. After viscosity reaches minimum, the first zero slope of the derivative of log of the ionic conductivity with respect to the cure time (DLIC) demarks the onset of gelation. DLIC also loosely correlated with degree of cure from onset of gelation to full cure and the DLIC plateau estimated vitrification when compared with DSC. Although these tests may be performed in a laboratory environment, DEA may be implemented to provide in-situ cure monitoring at production scale.

Conventional bulk wave ultrasound has also been implemented as a cure monitoring technique. For thermoset resins, ultrasonic velocity has been used to infer the degree of cure because of its association with the modulus of the resin. Bulk wave ultrasound, in pulse-echo mode, can monitor the completion of resin cure by measuring when the time delay plateaus (i.e., the ultrasonic velocity becomes a fixed value) in graphite/epoxy composites and epoxy matrices. Other ultrasonic phenomena have also been used for monitoring degree of cure including, attenuation (i.e., amplitude of signal), instantaneous phase, and the mean value of each frequency curve weighted by the maximum corresponding spectral amplitude." Both contact and air-coupled ultrasonic techniques have been employed for cure monitoring, with the latter negating the need for resin-transducer contact with the composite being monitored. Air-coupled ultrasonic cure monitoring, however, must account for the exothermal behavior of the cure process as well as the alteration of acoustic air path. Because the temperature varies greatly throughout the cure process, the speed of the sound wave in the air changes accordingly. This change in the speed of sound in air impacts the measured data because the transducers are not in direct contact with the composite, and changes in sound velocity must be accounted for to determine the correct time of flight in the composite.

A guided wave approach in carbon fiber reinforced polymer (CFRP) laminates has been used to demonstrate that the group velocity of guided waves propagating normal to the carbon fiber increased as final degree of cure of the composite increased, and the expected porosity level decreased (wave propagation in this case was normal to the carbon fiber through the panel and not through the thickness). However, this work was done using three separate composite panels that had already completed the cure process.

BRIEF SUMMARY OF THE INVENTION

One aspect of the present disclosure is a method of controlling a curing process for materials such as fiber reinforced composite materials. The method may include forming an uncured composite part from a plurality of layers of material having an uncured matrix and reinforcing fibers. An actuator is operably connected to a surface of the composite part at a first location, and at least one sensor is operably connected to a surface of the composite part at a second location that is spaced apart from the first location. The actuator and sensor are operably connected to a surface of the part directly or indirectly such that waves can be transmitted to (excited in) the part by the actuator, and waves propagating through the part can be detected by the sensor. The actuator excites waves in the composite part at the first location, and the waves propagate through the composite part due to internal reflection. At least one wave metric is measured at the second location by the sensor. At least one parameter of the curing process (e.g. cycle time, oven temperature, or pressure) is adjusted. The adjustment may be made before the composite part is fully cured. Alternatively, if a series of parts are being produced, the parameter may be adjusted after cure of a part is completed, during the cure cycle of the next part. The adjustment is based, at least in part, on a wave metric measured by the sensor. The part may comprise a composite part having a polymer matrix, or the part may comprise a polymer material that is not a composite.

Another aspect of the present invention is a method of in-process cure monitoring and control of fiber reinforced polymer matrix composite materials. The method includes exciting waves into a fiber reinforced polymer matrix material during curing of the polymer matrix material at a first location. At least one wave metric is measured at a second location that is spaced apart from the first location. The fiber reinforced polymer matrix material has acoustic boundaries that cause internal reflection of the wave to form guided waves that propagate through the fiber reinforced polymer matrix material from the first location to the second location.

The method includes adjusting at least one parameter of the curing process based, at least in part, on a wave metric measured at the second location.

The present disclosure involves a "guided wave" approach to monitor curing of composite materials such as carbon fiber reinforced polymer (CFRP) composites. At least one piezoelectric actuator (transducer) is utilized to introduce/excite sound (vibration) waves into composite part at a first location (e.g. a first point on a surface of the part). The physical boundaries of the part cause the waves to reflect internally and propagate through the part to a second location that is spaced apart from the first location. Internally reflected waves are generally referred to herein as guided waves. During the curing process a piezoelectric sensor at the second location is utilized to measure the amplitude, time of arrival ("TOA") or velocity, and other metrics of the guided waves. Additional sensors at other locations may be utilized to sense/measure wave propagation through other regions of the composite part. In general, the material properties of the composite part (e.g. a polymer matrix) change as the matrix cures, changing the propagation of the guided waves as the part cures. Data from the sensor(s) can be utilized to determine if the composite material is curing as expected (i.e. within an acceptable range), and the parameters of the curing process (e.g. time and/or temperature) can be adjusted before the curing process is completed to thereby provide improved consistency in the parts. The measured wave data may also be utilized to detect defects (e.g. voids in the matrix material). The curing process may be actively adjusted during a cure cycle of a part or prior to curing of a part if the wave data for a prior part shows that adjustment is required to minimize the formation of defects and/or to prevent formation of additional defects. If the detected defects exceed predefined acceptance criteria, the parts may be discarded. In this way, the need to conduct additional testing after a part is completed can be eliminated.

Key variables including composite material properties (viscosity and degree of cure) and phase transitions (gelation and vitrification) during a cure cycle may be identified from the amplitude and group velocity of guided waves. An automated cure monitoring system according to the present disclosure may include high-temperature piezoelectric transducers to excite guided waves through composite panels (e.g. Hexcel® IM7/8552 prepreg) during cure in an oven. Average normalized peak voltage, which is directly proportional to wave amplitude and inversely proportional to wave attenuation, may be selected as a metric to describe the guided waves phenomena throughout the entire cure cycle. The group velocity of the guided waves can be utilized to detect the transition of the matrix material from a rubbery state to a glassy state.

A guided wave system according to the present disclosure may compliment known cure monitoring technologies without completely replacing them. For example, dielectric cure monitoring has been used for cure monitoring in composite manufacturing of carbon-fiber reinforced epoxy composites. The guided wave system of the present disclosure may operate at higher frequencies than dielectric analysis, which may provide additional benefits such as potential defect detection.

The guided wave system of the present disclosure can be utilized in-situ in connection with known curing equipment and techniques. The guided wave system of the present disclosure is scalable from producing flat composite panels to full-scale complex structures utilized in aerospace and space applications (e.g., cylinders/barrels, wing skins, etc.). The guided wave system may include a robust linear array of high temperature sensors (piezoelectric transducers) incorporating modifications identified during development. Such modifications include the addition of five more sensors (original system had three), running with optimized equipment settings (e.g., actuation volts peak-to-peak and frequency), and more efficient data processing and display. The linear array of high temperature piezoelectric transducers may be replaced by a single multiplexed optical fiber with phase-shifted fiber Bragg gratings (PS-FBGs) which can sense wave signals during cure and in-service, enabling life cycle monitoring as the sensors remain embedded in the composite.

In contrast to known bulk wave ultrasound techniques that only provide information about a part directly underneath (or near) the ultrasonic transducer, a guided wave system/method according to the present disclosure interrogates a continuous wave path through the thickness of the panel along the line or path from the actuator to the sensor. The overall response of a large portion of the composite can be monitored instantaneously using a pair of piezoelectric transducers utilizing a guided wave approach.

The guided wave system/method of the present disclosure measures/estimates one or more variables such as viscosity, degree of cure, $T_g$, gelation, vitrification, and porosity during cure, and the process parameters (e.g. oven temperature, cure time, pressure) can be dynamically tuned/adjusted based on the measurements.

These and other features, advantages, and objects of the present invention will be further understood and appreciated by those skilled in the art by reference to the following specification, claims, and appended drawings.

BRIEF DESCRIPTION OF THE SEVERAL VIEWS OF THE DRAWINGS

The patent or application file contains at least one drawing executed in color. Copies of this patent or patent application publication with color drawing(s) will be provided by the Office upon request and payment of the necessary fee.

Figure 10:
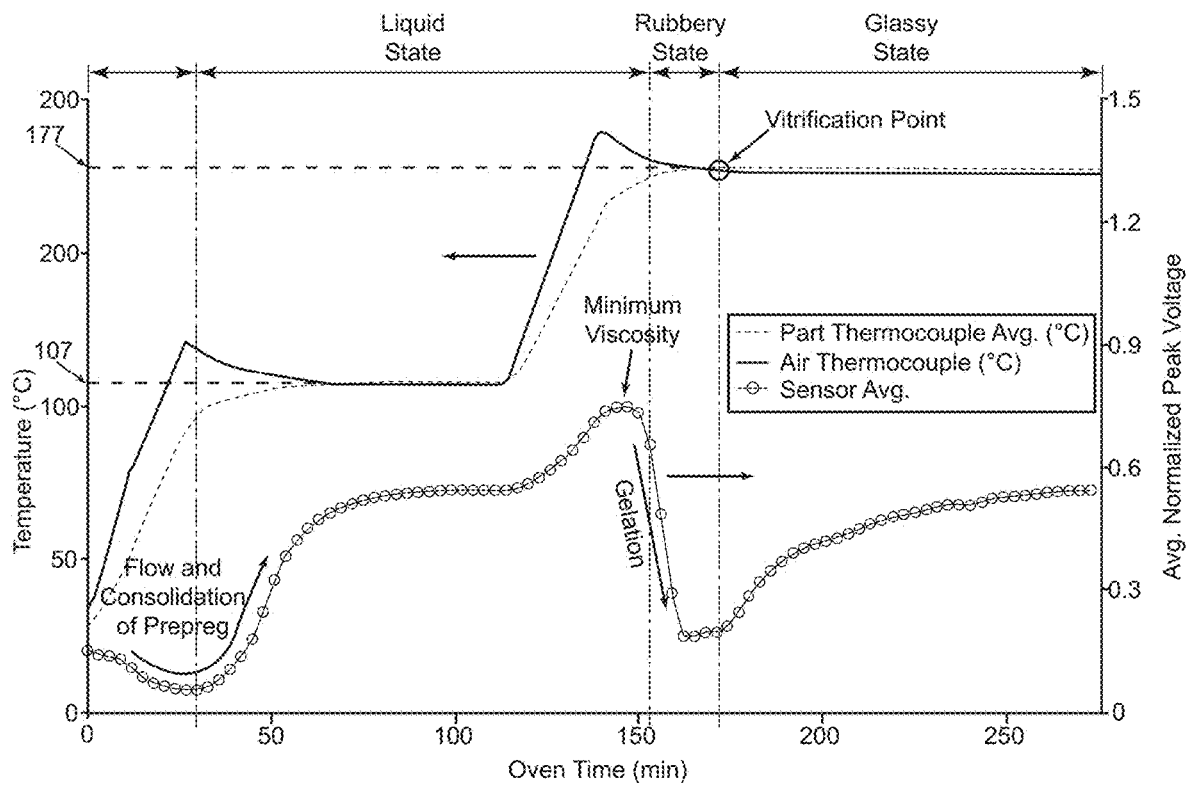
Figure 11:
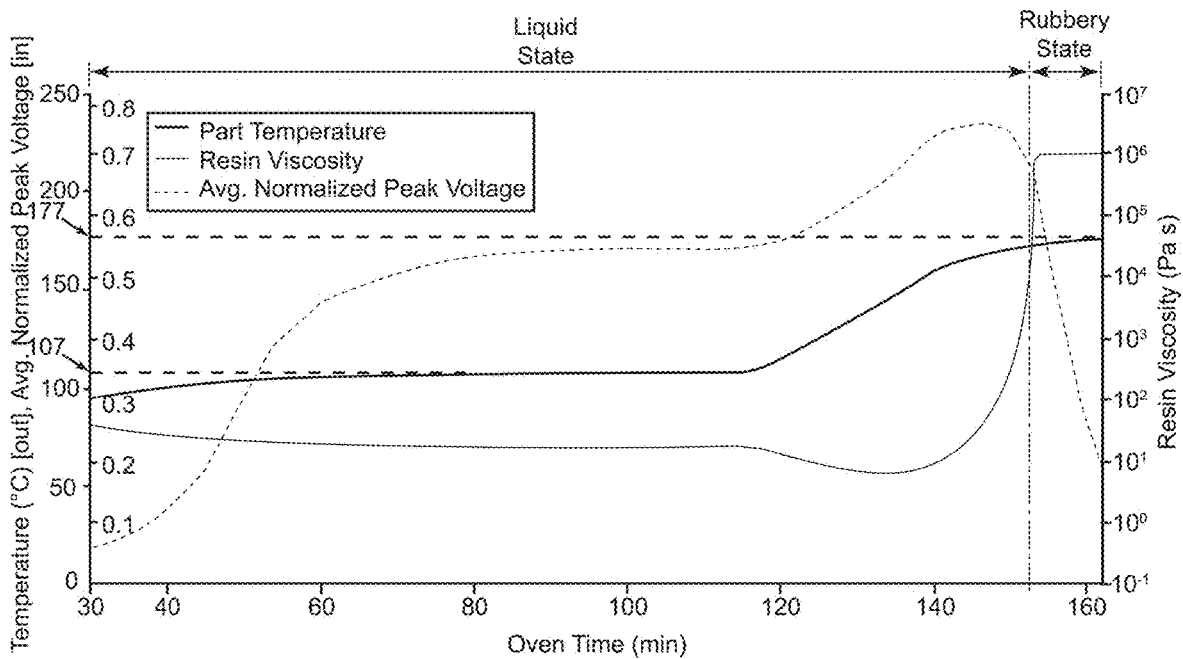
Figure 12:
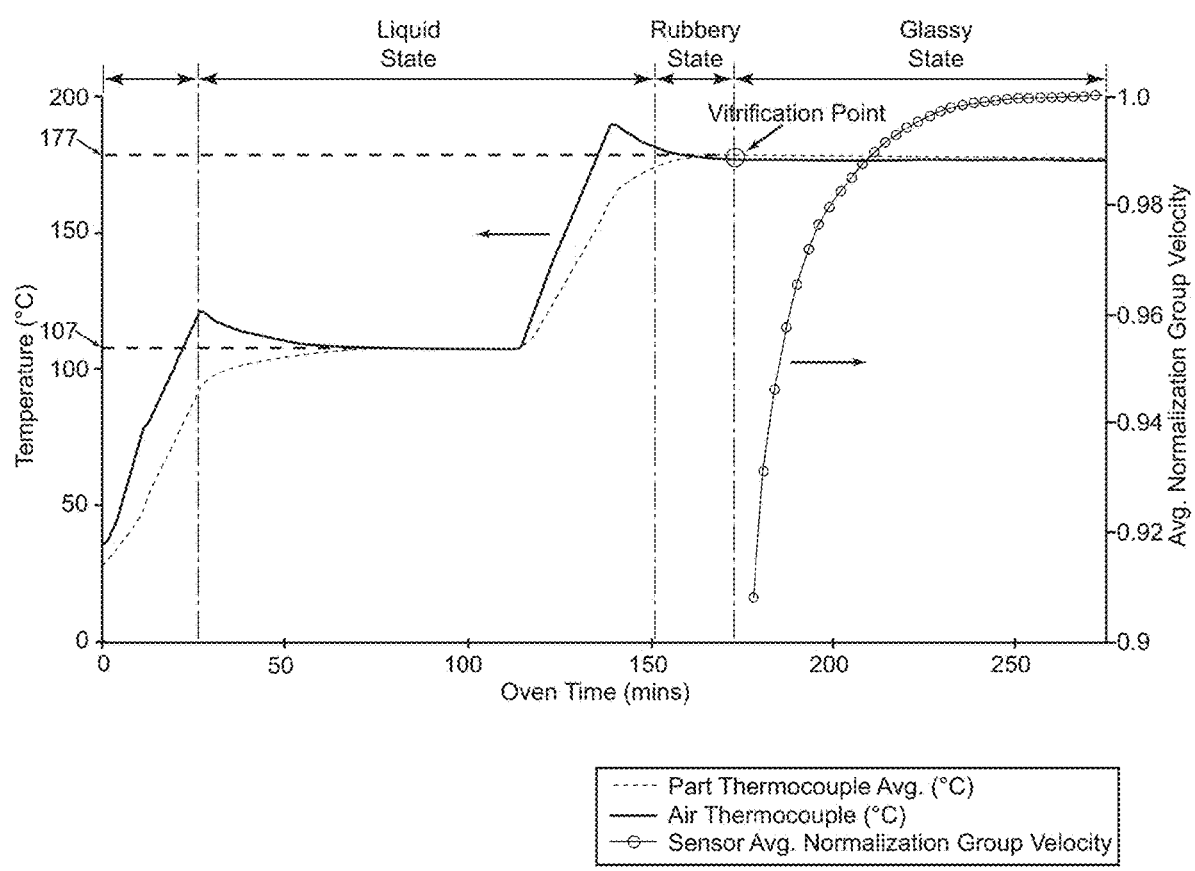
Figure 13A:
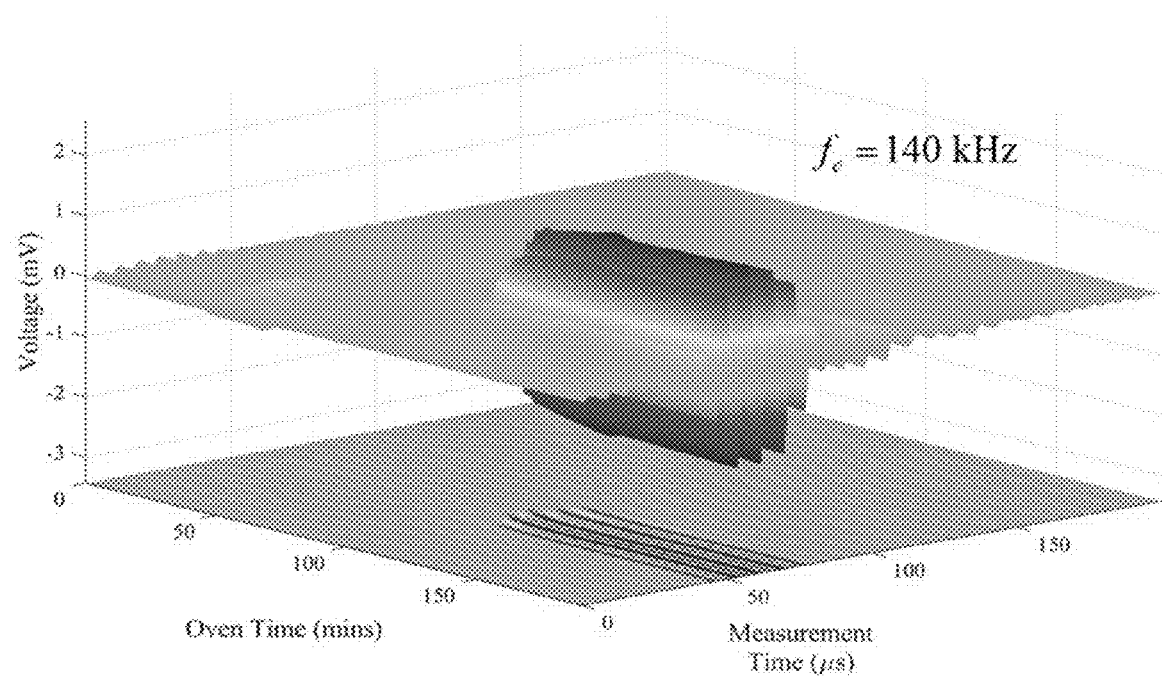
Figure 13B:
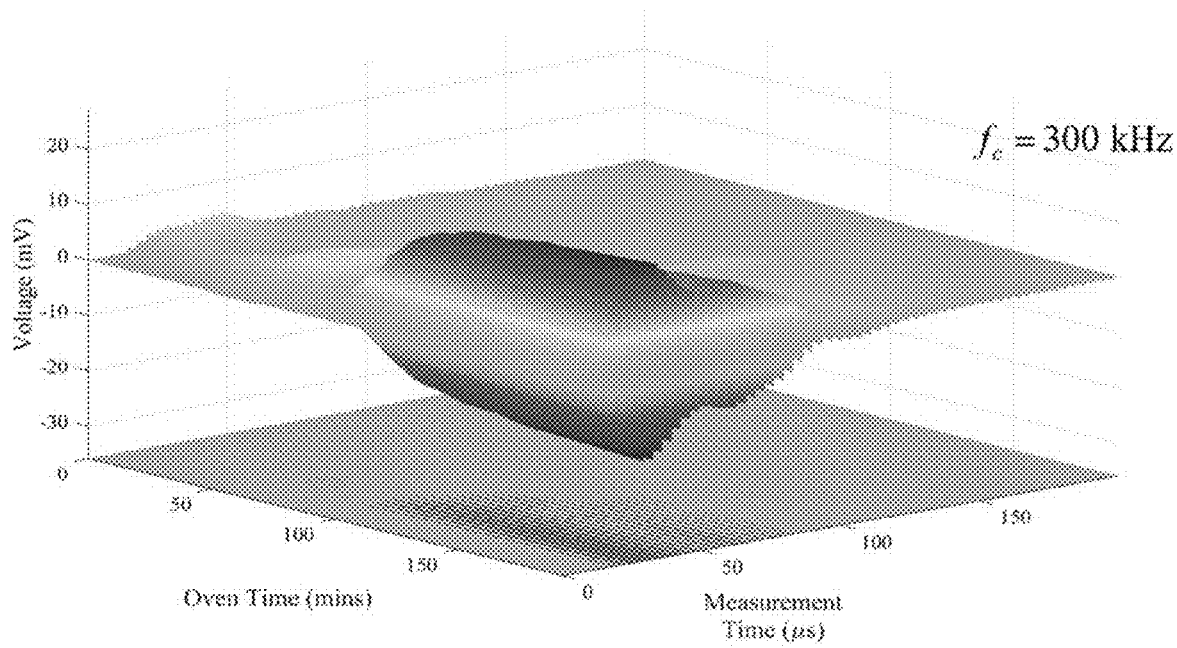
Figure 13C:
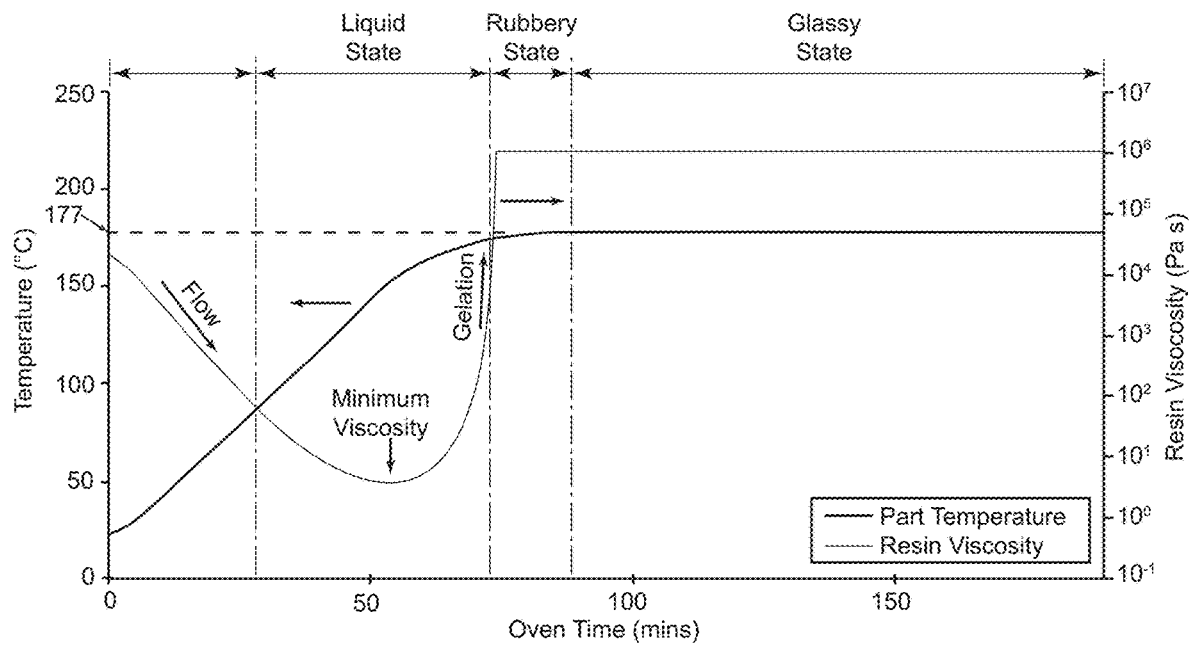
Figure 13D:
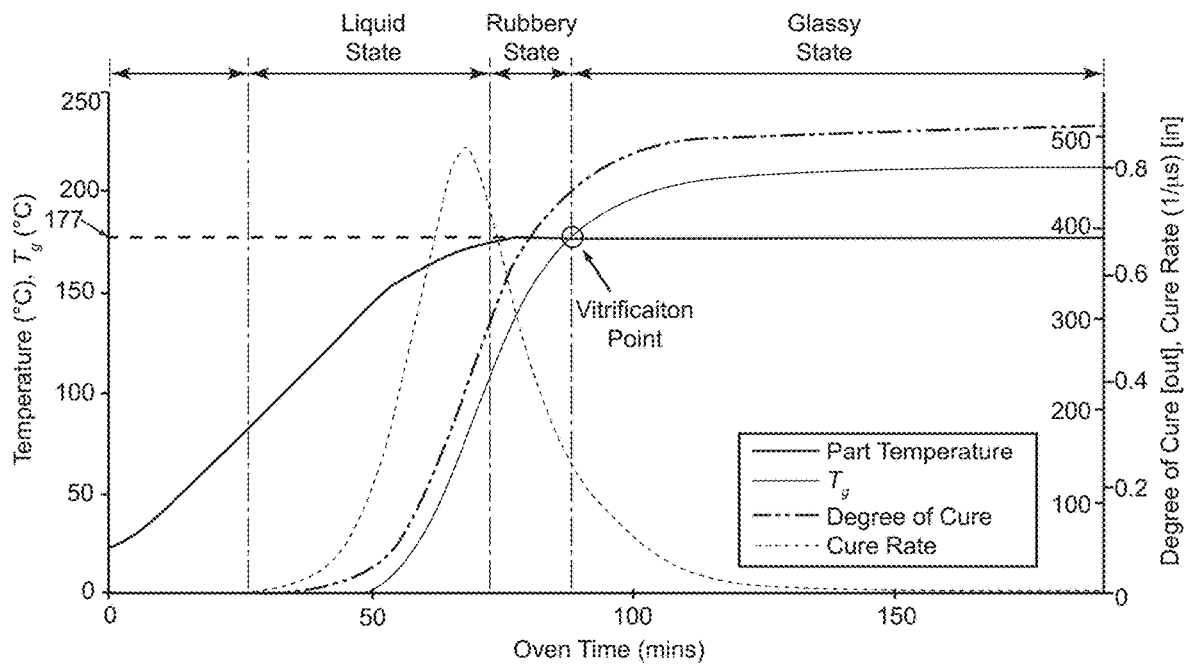
Figure 13E:
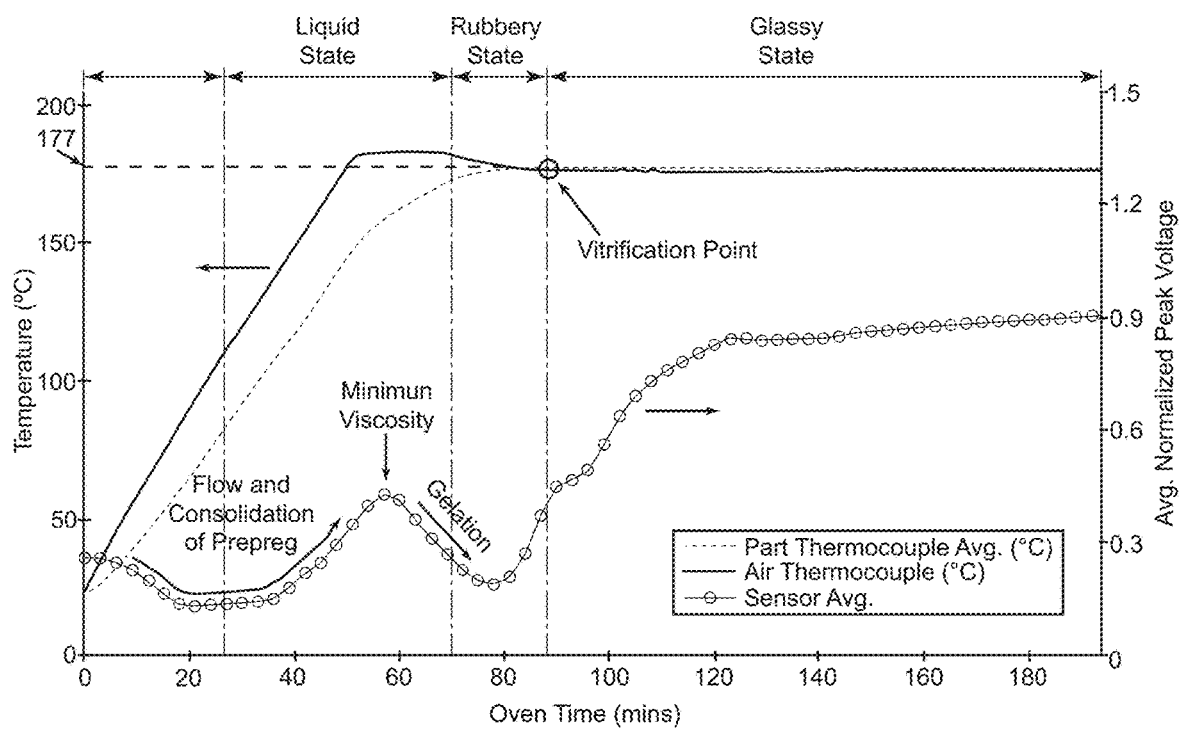
Figure 13F:
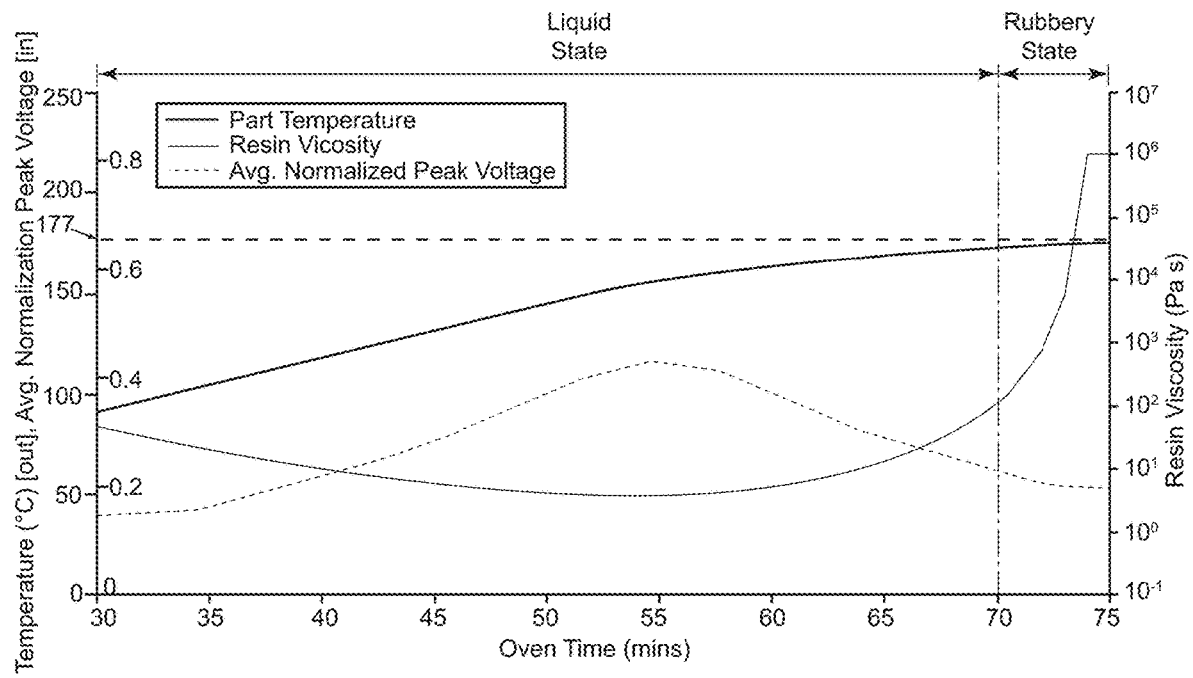

as predicted by Hexcel 8552® material model using a composite process simulation software zero-dimensional analysis;

FIG. 10 is a graph showing normalized peak voltages of the guided waves averaged from each of the fourteen actuation frequencies and eight sensors measured throughout the cure cycle;

FIG. 11 is a graph showing part temperature (outside left axis), average normalized peak voltage (inside left axis), and resin viscosity (outside right axis) shown during stages of cure in which the composite is in the liquid and rubbery states;

FIG. 12 is a graph showing group velocity of the $A_0$ wave mode for five excitation frequencies (120, 130, 140, 150, 175, and 200 kHz);

FIG. 13A shows a 3-D surface (top) and contour plot (bottom) of guided waves for 140 kHz at Sensor 2 through the cure;

FIG. 13B shows the 3D surface and contour plot for 300 kHz actuation at Sensor 2 throughout cure;

FIG. 13C shows part temperature and resin viscosity;

FIG. 13D shows part temperature (left vertical axis), $T_g$ (left vertical axis), degree of cure (right vertical axis), cure rate (right vertical axis), and vitrification point (i.e. the intersection between part temperature curve and $T_g$ curve) as predicted by Hexcel 8552® material model using RAVEN®;

FIG. 13E shows average normalized peak voltages of the guided waves for the cure cycle without the B-stage hold; and FIG. 13F shows average peak normalized voltage and resin viscosity.

DETAILED DESCRIPTION OF THE INVENTION

Figure 3:
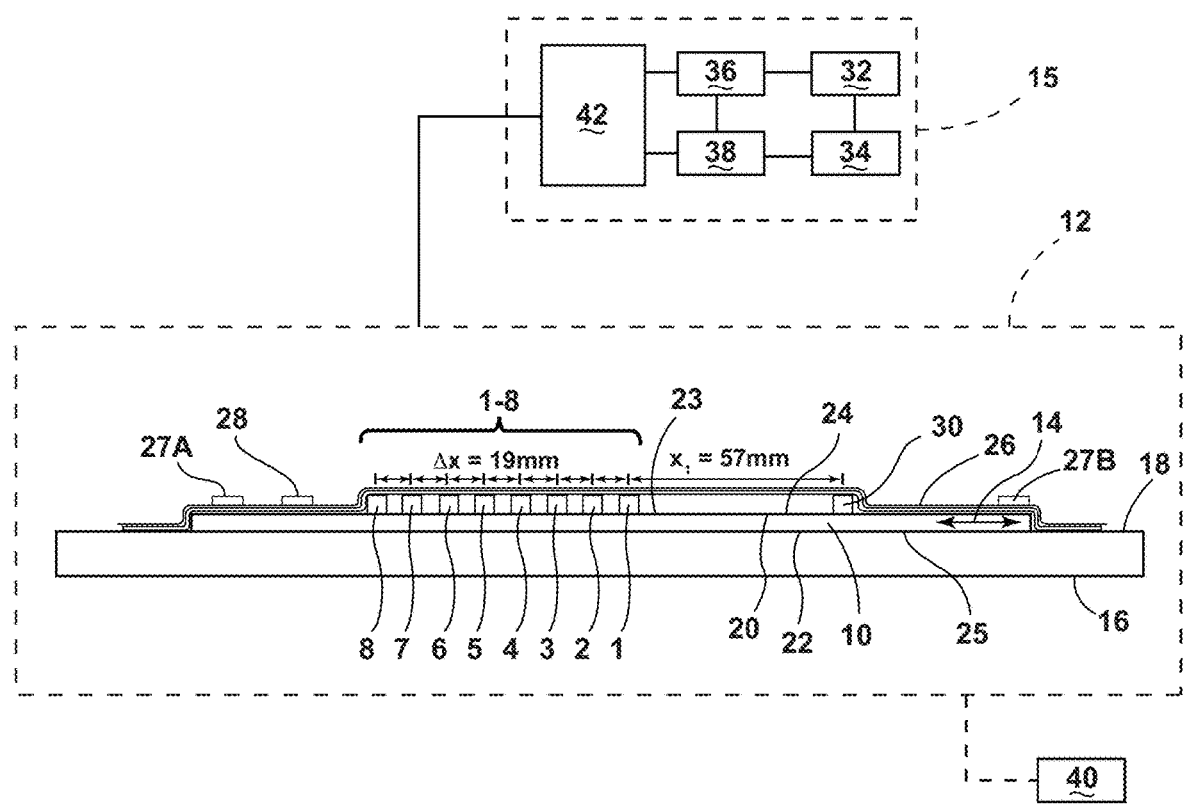
FIG. 3 is an automated guide wave system for in-process cure monitoring and control.

For purposes of description herein, the terms "upper," "lower," "right," "left," "rear," "front," "vertical," "horizontal," and derivatives thereof shall relate to the invention as oriented in FIG. 3. However, it is to be understood that the invention may assume various alternative orientations and step sequences, except where expressly specified to the contrary. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Figure 2:
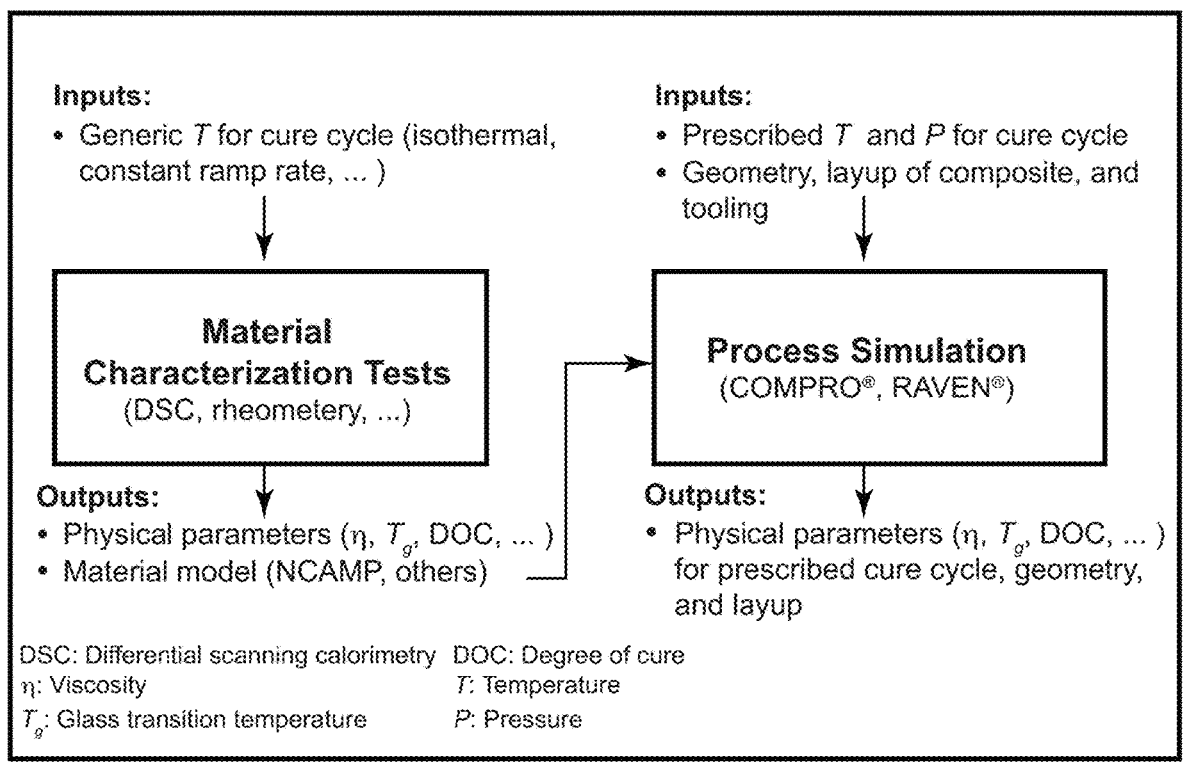
FIG. 2 is a flow chart for composite cure process simulation to determine phase transitions with guided wave-based measurements.

With reference to FIGS. 2 and 3, a process and system according to the present disclosure may be utilized to cure a composite part 10 in an oven 12. The oven 12 may comprise an autoclave or other suitable device of a type that is generally known. As discussed in more detail below, a control/monitoring system 15 is operably connected to the oven 12 to control the oven temperature, cure cycle time, pressure, and other parameters of the curing process. It will be understood that the present disclosure is not limited to a specific material or curing cycle/process. For example, part 10 may comprise either a polymer matrix composite or a ceramic matrix composite. Also, part 10 may comprise a material (e.g. polymer or ceramic) that does not include fibers or other composite components.

With reference to FIG. 3, the composite part 10 may comprise a plurality of layers of plies or layers of composite materials including a polymer (or ceramic) matrix and reinforcing fibers. The composite part 10 may comprise thermosetting polymer matrix materials or thermoplastic polymer matrix materials. If the composite part 10 comprises thermosetting polymer materials, the material is cured utilizing a cure cycle that typically includes heating the part 10 in oven 12 at a controlled temperature for a period of time. The temperature may be constant or ramped up or down as required for a particular material. If the part 10 comprises a thermoplastic matrix material, the part 10 may be formed (e.g. molded) at an elevated temperature and cured by cooling the part 10 to solidify the matrix material. Part 10 may, alternatively comprise a polymer that is not reinforced with fibers or other materials. Still further, part 10 may comprise a ceramic matrix composite material wherein curing of the ceramic matrix is monitored using guided waves. In the example discussed in more detail below, the composite part 10 comprises an epoxy resin matrix and a carbon fiber reinforcing material.

Referring again to FIG. 3, a tool plate 16 is positioned in the oven 12, and the composite part 10 is positioned on an upper surface 18 of the tool plate 16 prior to initiating the cure cycle. Release film 20 may be positioned between upper surface 24 of composite part 10 and a vacuum bag 26, and a release film 22 may be positioned between composite part 10 and upper surface 18 of tool plate 16. An optional breather 28 may be utilized for venting. A piezoelectric actuator 20 is positioned on or adjacent upper surface 24 of composite part 10 at a first location, and one or more sensors 1-8 are positioned on or adjacent surface 24 of composite part 10 at locations that are spaced apart from actuator 30. As discussed in more detail below, actuator 30 may comprise a piezoelectric device that generates vibrational waves that are introduced into the composite part 10. As also discussed in more detail below, the sensors 1-8 may comprise piezoelectric devices that detect vibrational waves in composite part 10 that are introduced by actuator 30. Sensors 1-8 and actuator 20 do not need to be in direct contact with a surface of part 10, provided the guided waves can be transmitted through other materials disposed between the sensors 1-8 and actuator 20 and part 10. It will be understood that sensors 1-8 and/or actuator 20 may be positioned on the upper or lower surface of part 10, and the sensors 1-8 and actuator 20 do not need to be positioned on the same side of part 10.

Upper and lower surfaces 24 and 25 of composite part 10 form acoustic boundaries that cause internal reflection of waves generated by actuator 30. Due to the internal reflection of the waves, the waves are guided from the first location (actuator 30) through the composite part 10 to the locations of the sensors 1-8. In the illustrated example, the composite part comprises 24 layers of prepreg composite material in which all of the fibers are oriented in the direction of the arrow 14. However, it will be understood that the composite part 10 may include numerous plies oriented in different directions as required for a particular application. Also, it will be understood that the tool plate and composite part 10 could have a variety of configurations, and the present invention is not limited to a flat or planar configuration as shown in FIG. 3. For example, part 10 could comprise an aircraft wing or fuselage having curved aerodynamic surfaces.

Figure 1:
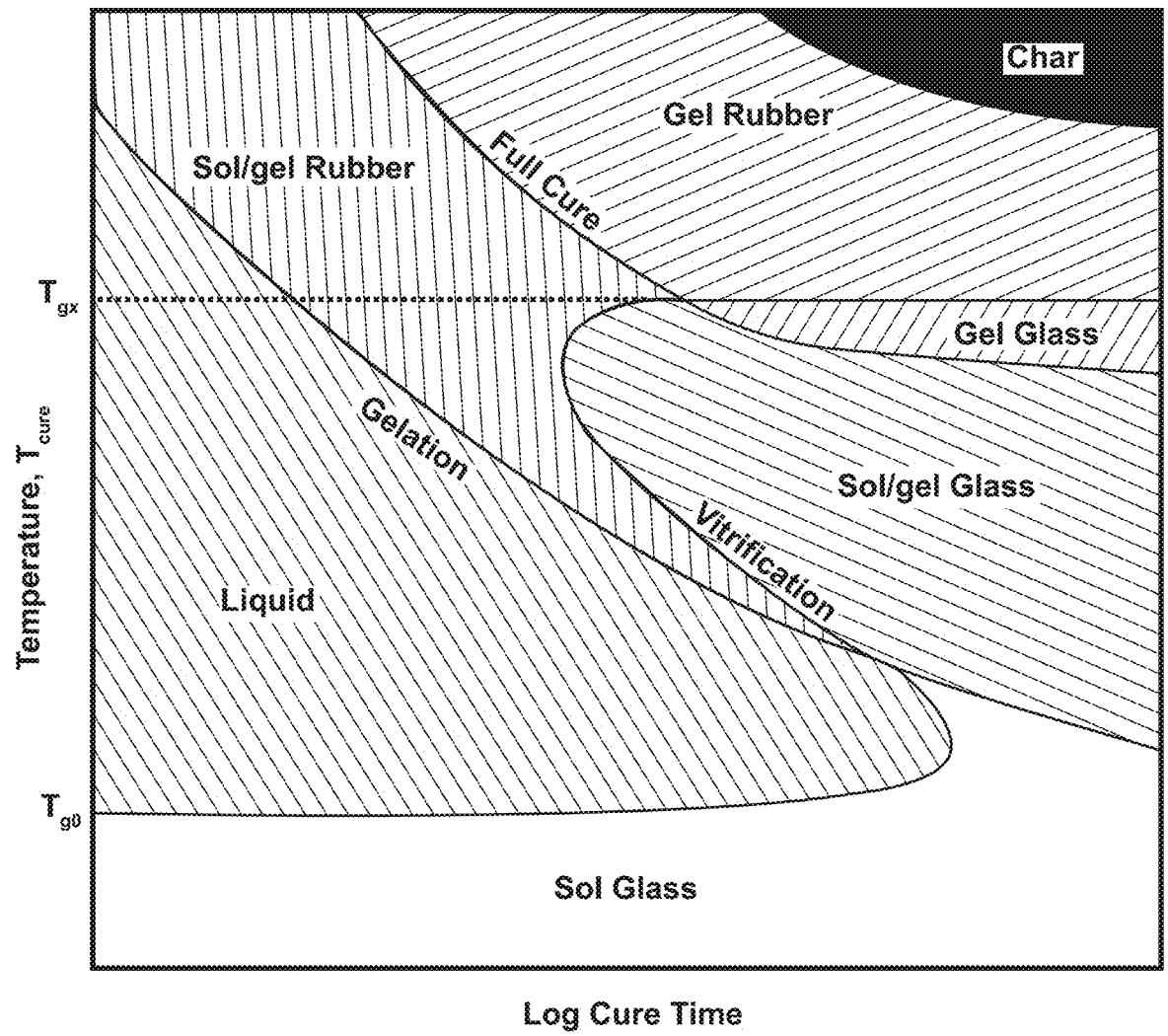
FIG. 1 shows generalized time-temperature-transformation (TTT) diagram for an epoxy resin.

Wave metrics such as the amplitude and group velocity of guided waves in a CFRP panel 10 (Size: 610 mm×178 mm) during cure in real-time may be utilized to control the curing process. These metrics may be utilized to identify key variables such as composite material properties (viscosity and degree of cure) and phase transitions (gelation and vitrification) during a cure cycle. The transformation of the resin from the liquid to rubbery state is typically referred to as gelation. The subsequent transformation from the rubbery state to the glass state is defined as vitrification. A generalized time-temperature-transformation (TTT) diagram for an epoxy resin (e.g., Hexcel® 8552) is shown in FIG. 1. In FIG. 1, $T_{g0}$ denotes the glass transition temperature of the initial formulation (completely uncured), $T_{g\infty}$ represents the glass transition temperature of the cross-linked resin at full cure, sol refers to solvent-soluble (i.e., ungelled), and gel refers to solvent-insoluble.

Testing/experimentation was performed to verify the process/control of the present disclosure. For comparison with experimental results, a semi-empirical cure process model was simulated with the specific cure parameters used in the experiment. The modeling flow chart (FIG. 2) illustrates the modeling procedure used to validate phase transitions (gelation and vitrification) and physical parameters from simulation using guided wave-based measurements. As seen in FIG. 2, material characterization tests were utilized to create a model which provides physical parameters for generic cure cycles. These characterization tests are laboratory-scale testing methods (e.g., DSC and rheology), which provide valuable information about the thermal and flow characteristics of the material. Knowledge of these characteristics is useful for cure response modeling. For accurate testing of composite structures, layup characteristics and temperature and pressure values specific to the simulated cure cycle are preferably specified. The material-specific models can then be utilized to simulate the cure kinetics of the composite under experimental conditions. The RAVEN® simulations carried out for this employed this process.

The experimental setup for the automated guided wave system for in-process cure monitoring is shown in FIG. 3. In the example/test, two twenty-four ply panels 10 (FIG. 3) were laid up by hand using IM7/8552, 35% resin content, 190 gsm unidirectional prepreg (Hexcel® Corporation). The panels were 610 mm×178 mm×4.6 mm (nominal) and the layup was [0$_{24}$]. The panels 10 were cured in an oven 10 following two commonly used cure cycles for this material system. The first cure cycle was a two stage cure with a B-stage hold. The temperature was ramped to 107° C. at 2.8° C./min, held one hour, ramped to 177° C. at 2.8° C./min, held two hours, then cooled down. The second cure cycle (commonly used in industry for thin laminates) did not include the B-stage (107° C.) hold, but rather ramped directly to 177° C. at 2.8° C./min, held two hours, then cooled down.

Both panels 10 were interrogated during the entire cure period utilizing guided waves generated by actuator 30. A guided wave was excited into the plate 10 using a five-cycle Hanning windowed sinusoidal toneburst signal emitted from a waveform generator 32 (Agilent Technologies: 81150A) to an amplifier 34 (Krohn-Hite Corporation: Model 7602M) to a piezoelectric transducer 30 (Physical Acoustics Corporation: Nano-30 (ø7.9 mm, height: 7.1 mm, frequency range: 150-750 kHz, resonant frequency: 300 kHz)) that is rated for use up to 177° C. The amplifier 34 magnified the input signal to a peak-to-peak voltage of approximately 120 V. The plate response along the fiber direction was recorded by identical piezoelectric transducers/sensors 1-8 in a pitch-catch configuration on two oscilloscopes 36, 38 (Agilent Technologies: MSO9064A and Tektronix: MSO3014).

Fluorinated ethylene propylene (FEP) release film 20, 22 was placed on the top and bottom 24, 25 of the composite panel 10. Sensors 1-8 were bonded to a thin (0.1 mm) sheet of steel 23 ("caul plate") that was placed on top 24 of the panel 10. The caul plate 23 prevents sensors 1-8 from being pressed into upper surface 24 of panel 10 during cure, while still allowing the guided wave to propagate in the composite to be measured. Sensors 1-8 were located at distances, x, from the actuator 30 of 57, 76, 95, 114, 133, 152, 171, and 190 mm, respectively. A vacuum bag 26 and breather cloth 28 covered the panel 10 and full vacuum was applied using a vacuum pump 40.

For testing purposes, an oven 12 was used to cure the panel. However, it will be understood that the guided wave system of the present disclosure may be utilized in connection with suitable devices such as an autoclave to provide the proper pressure (e.g. 690 kPa). A port in the back of the test oven (not shown) may be utilized for ingress/egress of cables (not shown). It will be understood that the example described herein demonstrates use of a guided wave system and process at elevated temperatures during cure, and shows that meaningful information can be derived from the results. However, the goal of this example was not to produce a finished part in a production setting. Thus, some of the conditions (e.g. pressure) that are typically used for production of finished components were not duplicated in this example.

Figure 4:
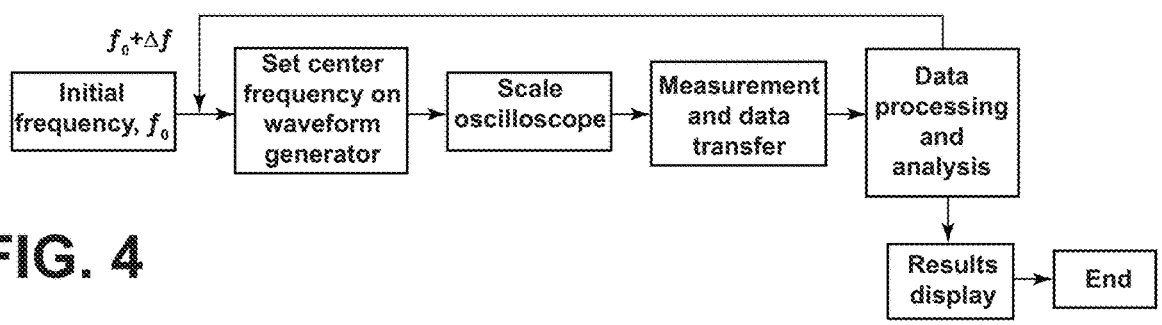
FIG. 4 is a flowchart showing an automated algorithm for data collection and analysis of guided waves for in-process cure monitoring.

The automation code for the sensing system of the test was written in MATLAB® and utilized the Instrument Control Toolbox to control both the waveform generator 32 and the oscilloscopes 36, 38. The algorithm is outlined in FIG. 4. The center frequency of the five-cycle, Hanning windowed sinusoidal toneburst signal was set on the waveform generator. During each iteration, the center frequency was cycled through fourteen frequencies (100, 110, 120, 130, 140, 150, 160, 175, 200, 225, 250, 275, 300, 325, and 350 kHz). The range of voltages to be measured by the oscilloscopes 36, 38 was set based on the peak voltage recorded at that center frequency on the previous iteration. Dynamically scaling the range on the oscilloscopes 36, 38 based on the previous iteration ensured that the range was minimized to increase signal to noise ratio (SNR) while keeping it large enough to prevent the recorded voltage from being cut off. After the equipment was set, sixteen measurements were averaged on the oscilloscope and transferred to the computer. These data were processed through a bandpass filter and analyzed in real-time using MATLAB®. The instantaneous recorded waveforms, the full time history waveforms, and key metrics such as peak voltage were all displayed on-screen during cure. This process, which was completely automated by a PC 42 running MATLAB® scripts and functions, was iterated throughout the cure of the test part 10.

Figure 5:
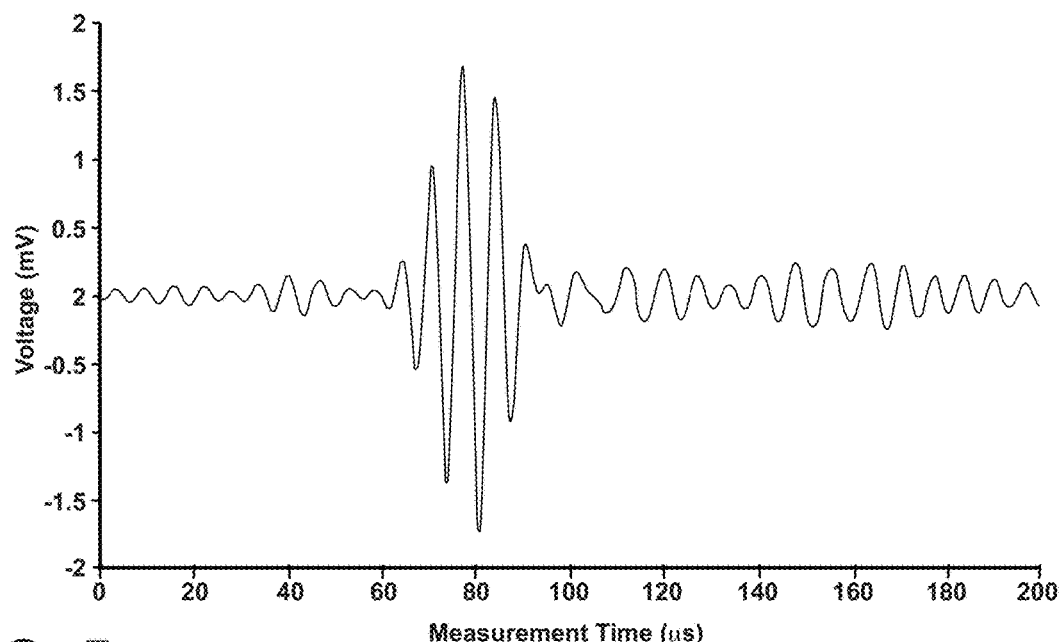
FIG. 5 is plate response at a sensor for a five-cycle Hanning window toneburst actuation with center frequency at 140 kHz at an oven time of 272 minutes.

The plate response at sensor 4 (FIG. 3) for five-cycle Hanning window toneburst actuation with center frequency 140 kHz at cure time around 270 minutes in the entire cure cycle is shown in FIG. 5. By assembling each individual waveform data at a particular sensor and center frequency of actuation, the full time history of the plate response can be viewed as a three-dimensional surface and contour plot. This is shown for Sensor 4 with an actuation center frequency of 140 kHz in FIG. 6. FIG. 5 is the last "slice" of FIG. 6.

Figure 6:
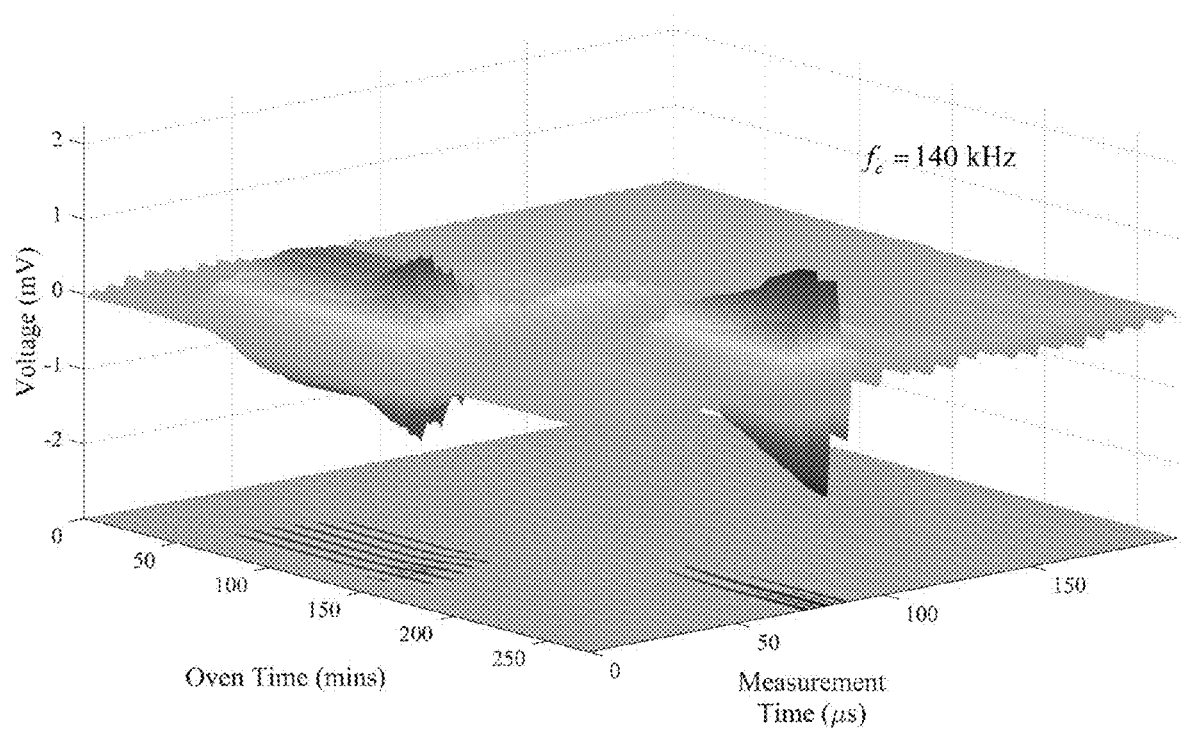
FIG. 6 is a 3-D surface (top) and contour (bottom) plot of guided waves for 140 kHz actuation at a sensor throughout the cure.
Figure 7:
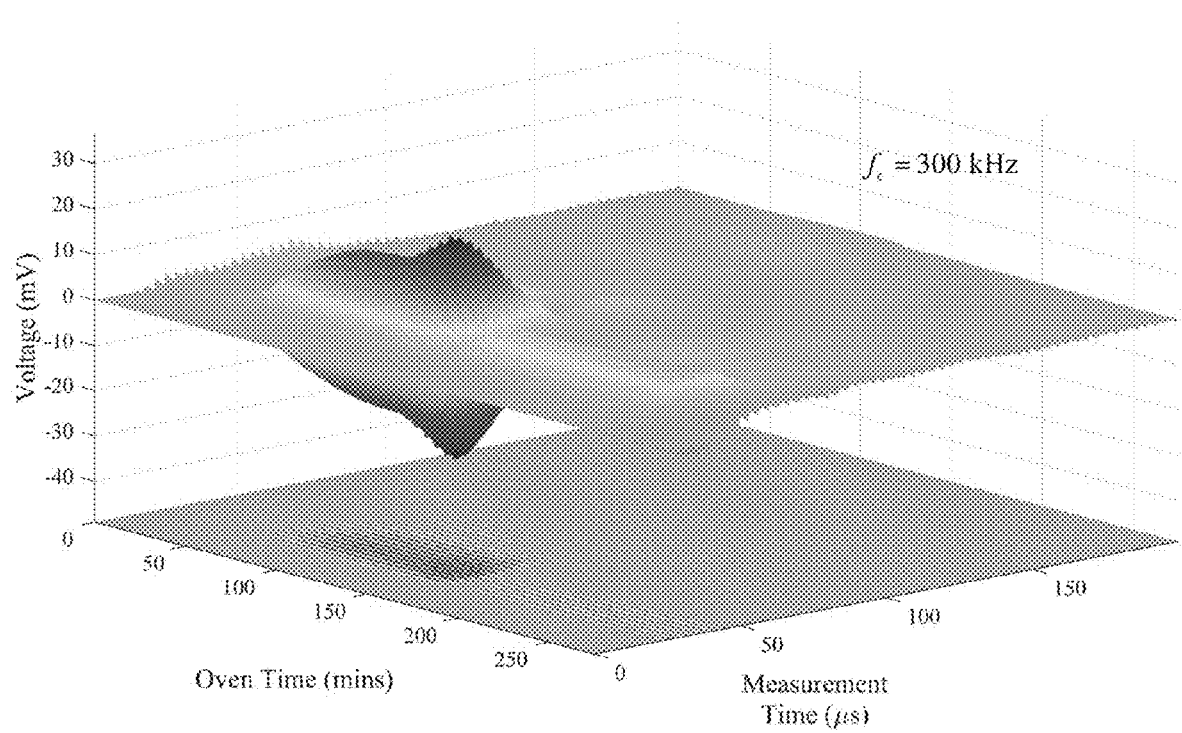
FIG. 7 is a 3-D surface (top) and contour (bottom) plot of guided waves for 300 kHz actuation at a sensor throughout the cure.

FIG. 7 is somewhat similar to FIG. 6, and shows a three-dimensional surface and contour plot of the full time history of the plate response at Sensor 4 excited by a five-cycle Hanning window toneburst actuation with a center frequency of 300 kHz.

Referring to FIG. 6, at a center frequency of 140 kHz, the A wave was dominant in the glassy state, whereas the S0 wave was dominant in the glassy state at a center frequency of 300 kHz (FIG. 7). This can be seen in the surface/contour plots from an oven time of about 170 minutes to the end of cure. Trends in wave amplitude and time of arrival for these plots are discussed below.

In addition to the experimental study, a zero-dimensional (material only) simulation of the cure response (FIGS. 8 and 9) was performed using RAVEN® composite process simulation software. The material model utilized in RAVEN® is a semi-empirical material model based on lab-scale tests (e.g., DSC and rheology). The average temperature of the two part thermocouples 27A, 27B (FIG. 3) was modeled as the temperature of the part. The degree of cure Equation 1.0, cure rate Equation 2.0, and resin viscosity Equation 3.0 were direct outputs of the simulation.

$$\sigma(t) = \frac{\int_{t_i}^{t}(\dot{q} - \dot{q}_{baseline})dt}{H_T} \qquad 1.0$$

$$\frac{d\sigma}{dt} = \frac{\sigma_t - \sigma_{t-\Delta t}}{\Delta t} \qquad 2.0$$

$$\eta = \begin{cases} \eta_{01}e^{\frac{E_1}{RT}} + \eta_{02}e^{\frac{E_2}{RT}}\left(\frac{\sigma_g}{\sigma_g - \sigma}\right)^{A+B\sigma+C\sigma^2} & \eta < \eta_{max} \\ \eta_{max} & \eta \geq \eta_{max} \end{cases} \qquad 3.0$$

In Equation 1.0 above, $\sigma$ is degree of cure, $\dot{q}$ is specific heat flow, $\dot{q}_{baseline}$ is the baseline heat flow, and $H_T$ is total reaction heat. Equation 2.0 is a time derivative of Equation 1. In Equation 3.0, $\eta$ is the viscosity, R is the universal gas constant (8.314 J/K mol), T is temperature, $\sigma$ is degree of cure, and the remaining variables are model fit parameters to rheology tests ($\eta_{01}=7.5\times10^{-11}$ Pa s, $\eta_{02}=4.81\times10^{-2}$ Pa s, $E_1=81908$ J/mol, $E_2=13228$ J/mol, $\sigma_g=0.545$, A=2.466, B=0.0, C=0.0, $\eta_{max}=1.0\times10^6$ Pa s).

A zero-dimensional analysis in RAVEN®, which assumes constant temperature through the thickness, was shown to have insignificant difference in the composite curing response with a one-dimensional (drill-through) analysis, which did account for temperature variation throughout the thickness. This is primarily because the composite panel is thin and the temperature gradient across the thickness is therefore negligible. For the one-dimensional comparison analysis, the recorded air temperature of the oven 12 and the average temperature of the two part thermocouples 27A, 27B (modeled as the temperature of the vacuum bag) were utilized as inputs to the model. Heat transfer coefficients were applied at the boundaries of the model which included each material layer listed in the materials and methods section. A heat transfer coefficient of 30 W/m2K was used throughout all simulations.

Figure 9:
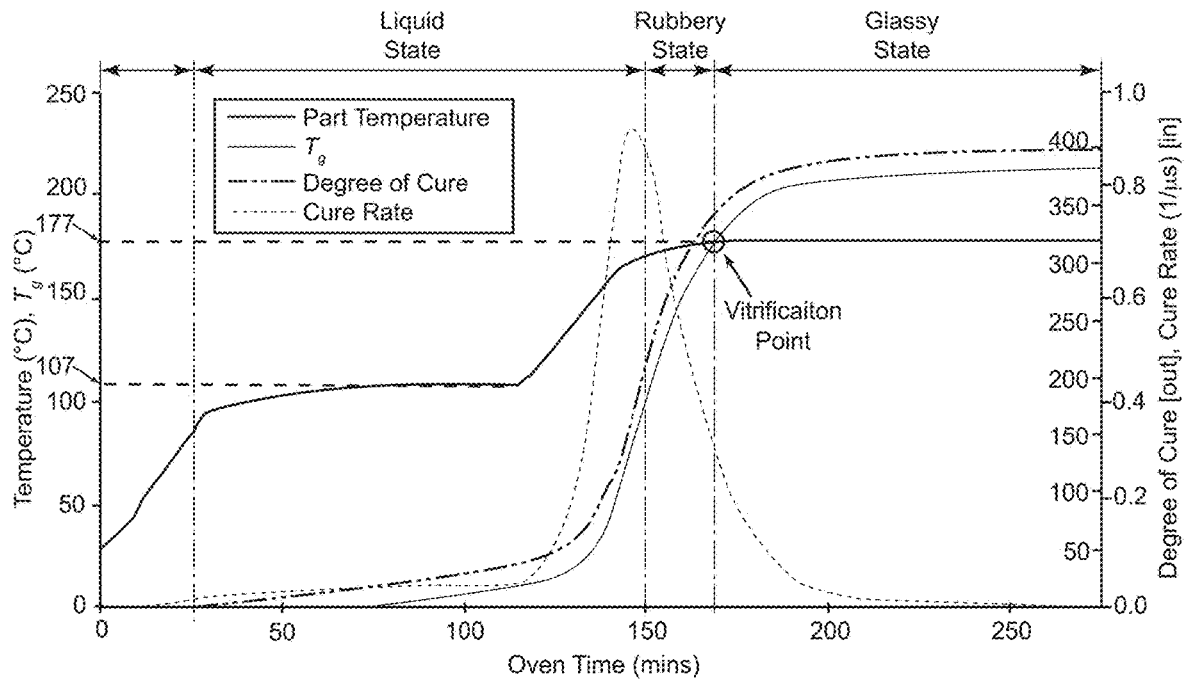
FIG. 9 is a graph showing part temperature (outside left axis), $T_g$ (outside left axis), degree of cure (outside right axis), cure rate (inside right axis), and vitrification point (intersection between part temperature curve and $T_g$ curve)

The glass transition temperature ($T_g$) was calculated using the DeBenedetto equation:

$$T_g = T_{g0} + \frac{\lambda\sigma}{1-(1-\lambda)\sigma}(T_{g\infty} - T_{g0}) \qquad 4.0$$

where $\sigma$ is the degree of cure and $\lambda=0.78$, $T_{g0}=-7°$ C., and $T_{g\infty}=250°$ C. which are model parameters for Hexcel® 8552 resin that are fit to experimental data during material characterization. Vitrification is the process in which the curing composite transitions to a glassy state. The onset of vitrification occurs as the $T_g$ approaches the temperature of the part being cured (FIG. 9). The rubbery state and glassy state in the following figures are analogous to sol/gel rubber and sol/gel glass in FIG. 1, respectively.

Figure 8:
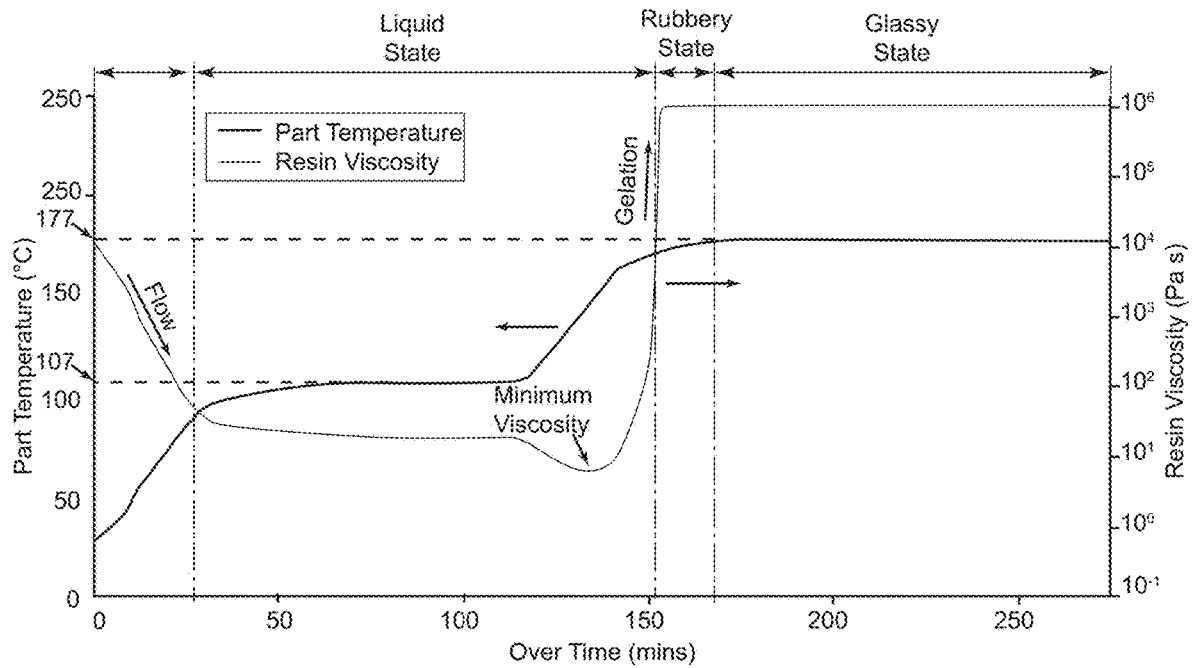
FIG. 8 is a graph showing part temperature (left vertical axis) and resin viscosity (right vertical axis) as predicted by a composite material model using a composite process simulation software zero-dimensional analysis.

FIG. 8 shows part temperature (left vertical axis) and resin viscosity (right vertical axis) as predicted by Hexcel 8552® material model using RAVEN® composite process simulation software zero-dimensional analysis. The shaded regions correspond to the state of the composite throughout cure. FIG. 9 shows part temperature (outside left axis), $T_g$ (outside left axis), degree of cure (outside right axis), cure rate (inside right axis), and vitrification point (intersection between part temperature curve and $T_g$ curve) as predicted by Hexcel 8552® material model using RAVEN® composite process simulation software zero-dimensional analysis. Shaded regions correspond to the state of the composite throughout cure. The peak voltage, $V_{peak}$, from each measurement was determined as the maximum of the measured signal Equation 5.0:

$$V_{peak}(OT_i, x_j, f_{c_k}) = \max_t(V(OT_i, x_j, f_{c_k}, t_l)) \qquad 5.0$$

where $OT_i$, $x_j$, and $f_{c_k}$ denote the discrete oven time, location (i.e., sensor), and center frequency of actuation, respectively, at which the measurement was taken. For reference, the plate response in FIG. 5 was taken at OT=272 minutes, x=114 mm (Sensor 4), and $f_c$=140 kHz and the resulting peak voltage, $V_{peak}$, of the signal was approximately 1.7 mV. The peak voltages were then normalized by dividing the peak voltage value from every measurement by the maximum voltage observed during the entire cure cycle by that sensor and actuation frequency according to Equation 6.0:

$$V_{norm,peak}(OT_i, x_j, f_{c_k}) = \frac{V_{peak}(OT_i, x_j, f_{c_k})}{\max_i(V_{peak}(OT_i, x_j, f_{c_k}))} \qquad 6.0$$

This normalized the peak voltage values to a number between zero and one. The maximum value of one occurs at the peak voltage, and this maximum is not necessarily at the end of a cure cycle.

All of the sensors 1-8 measure the guided waves at an identical oven time in one measurement. However, because the system loops through the actuation center frequencies, measurements at different actuation center frequencies occur at slightly different oven times (approximately 30 second increments).

$V_{norm,peak}$ was first interpolated at defined oven times. $V_{norm,peak}$ was then averaged across sensor and center actuation frequency at defined oven times according to Equation 7.0:

$$V_{avg,norm,peak}(OT) = \frac{1}{np}\sum_{k=1}^{p}\sum_{j=1}^{n}V_{norm,peak}(OT, x_j, f_{c_k}) \qquad 7.0$$

The average normalized peak voltages, $V_{avg,norm,peak}$, are the averaged results from every sensor and actuation frequency throughout the entire cure cycle. This was done to remove sensor and frequency variation in the results allowing for cleaner interpretation and communication of the effect of curing on the amplitude of the guided waves.

FIG. 10 displays the air temperature and the average part thermocouple temperature recorded by the oven 12 as well as the average normalized peak voltages of the guided waves throughout the cure cycle.

FIG. 11 shows part temperature, resin viscosity, and average normalized peak voltage for the liquid and rubbery states during cure. As is apparent in this plot, average normalized peak voltage and resin viscosity have an approximately inverse relationship. As a result, average normalized peak voltage is a good indicator of resin viscosity during these stages of cure.

FIG. 12 shows the average normalized group velocities of the $A_0$ Lamb wave mode for five excitation frequencies (120, 130, 140, 150, 175, and 200 kHz) as well as the air temperature and the average part thermocouple temperature. The data represents the "apparent" group velocity since only envelope velocity was investigated without considering details of dissipative attenuation. The $A_0$ Lamb wave mode was the dominant wave mode at these frequencies when the resin of the composite was in the glassy state, or in the transition from the rubbery to the glassy state (oven time approximately 175 to 270 minutes). This is shown more clearly in FIG. 6. To determine the group velocity, the time of arrival (TOA) was identified by finding the measurement time at which $V_{peak}$ occurred. A linear fit was then made to the sensor location, x, and TOA at each frequency and oven time. The slope of this linear fit is the group velocity $c_g$ of Equation 8.0:

$$x = c_g \times TOA + B \qquad 8.0$$

where B is a constant of the linear fit.

The group velocity was then averaged across center actuation frequency (Equation 9.0) at the defined oven times and then normalized (Equation 10.0).

$$c_{g,avg}(OT) = \frac{1}{p}\sum_{k=1}^{p} c_g(OT, f_{c_k}) \qquad 9.0$$

$$c_{g,norm,avg}(OT) = \frac{c_{g,avg}(OT)}{\max(c_{g,avg}(OT))} \qquad 10.0$$

As with peak voltage, the group velocity values were first interpolated at defined oven times because measurements at different actuation center frequencies occur at slightly different oven times (about 30 second increments).

FIG. 13A shows a 3-D surface (top) and contour plot (bottom) of guided waves for 140 kHz at sensor 2 throughout the cure. FIG. 13B shows the 3D surface and contour plot for 300 kHz actuation at Sensor 2 throughout cure. FIG. 13C shows part temperature and resin viscosity, and FIG. 13D shows part temperature (left vertical axis), $T_g$ (left vertical axis), degree of cure (right vertical axis), cure rate (right vertical axis), and vitrification point (i.e. the intersection between part temperature curve and $T_g$ curve) as predicted by Hexcel 8552® material model using RAVEN®. FIG. 13E shows average normalized peak voltages of the guided waves for the cure cycle without the B-stage hold, and FIG. 13F shows average peak normalized voltage and resin viscosity.

The key transition points during cure cycle can be identified utilizing a cure monitoring system and process according to the present disclosure. First, during the initial temperature ramp the viscosity of the resin is reduced (drops), and the resin begins to flow and the composite begins to consolidate. During this time, an increase in the average normalized peak voltage of the guided waves was observed (FIGS. 10 and 13E). During the ramp to 177° C., the viscosity dropped to a minimum corresponding to the maximum average normalized peak voltage (FIG. 10 and FIG. 13E).

When the resin begins to gel (during the ramp to 177° C.), the average normalized peak voltage starts dropping and continues to drop throughout gelation (FIGS. 10 and 13E). Although denoted as a single point in time, it will be understood that gelation is a process and does not occur instantaneously. In general, the gelation "point" is the time prior to which one would describe the resin as a liquid and after which one would describe the resin as a rubber. The decrease of normalized amplitude during gelation may be understood by analogy to dropping a pebble in a lake (water) compared to dropping a pebble in honey. The wave generated would have a higher amplitude (lower attenuation) in water than it would in higher viscosity honey.

Also, the average normalized peak voltage increases throughout vitrification (transition from rubbery to glassy state) before reaching a plateau just prior to the end of cure (FIGS. 10 and 13F).

The vitrification point denoted in both the simulation and experimental results was calculated by simulation from the semi-empirical model. In general, identifying the vitrification point solely from experimental results would be difficult. However, one can readily determine if vitrification is occurring or has occurred by the increase in amplitude and subsequent plateau during the transition from rubbery to glassy state. Similar to gelation, vitrification is a process and the vitrification "point" is the time prior to which one would describe the resin as rubbery and after which one would describe the resin as a glassy. It does not occur instantaneously at a single point in time.

These trends were observed in both cure cycles. One difference between the two cure cycles is the ratio of the average normalized peak voltage when the resin was in the liquid state (including at minimum viscosity) compared with the glassy state near the end of cure. The average normalized peak voltage was higher in the liquid state than the glassy state for the two-stage cure cycle (FIG. 10) when more cure time was spent in the liquid state. However, the average normalized peak voltage was higher in the glassy state than in the liquid state for the cure cycle without the B-stage hold (FIG. 13F).

Also, as the degree of cure (FIG. 8) from the Hexcel 8552® material model simulated by RAVEN® increased, the group velocity (FIG. 12) of the guided waves increased (i.e., degree of cure was directly proportional to group velocity). In addition, the group velocity curve resembled the upper half of the S-shape degree of cure curve. The group velocity curve may be used as a qualitative measure to predict the degree of cure of the matrix material. It will be understood that factors such as temperature, modulus of the composite, and material structure may have frequency-dependent effects. In the testing described herein, each of these trends were consistent over the frequency range investigated when the $A_0$ wave mode was dominant. The $A_0$ wave mode became dominant near vitrification as the resin transitioned from the rubbery to glassy state. The development of the $A_0$ wave mode can be clearly seen in FIG. 6 beginning at an oven time of approximately 175 minutes.

It will be understood that the goal of testing described herein was not to produce a high quality composite panel, but rather to develop and test the system and quality of the signals recorded during cure at elevated temperatures inside an oven 12. Additional modifications may be made to ensure the parts fabricated utilizing the system/process of the present disclosure have no sign of mark-off in the regions where the sensors were placed above the part 10 on the caul plate 23.

Dispersion curves for the composite laminate during cure may be developed to account for the wavenumber, phase velocity, and group velocity frequency dependence throughout the cure cycle. Denser spacing of the sensors may be utilized to measure higher wavenumbers (smaller wavelengths) as with the $A_0$ wave mode.

The measured wave metrics (amplitude, TOA, velocity) may be utilized to adjust a cure cycle parameter such as cure cycle time or temperature or pressure. The adjustment may be made during the cycle of a part. This adjustment to the cure recipe (cycle) may also be after a part is cured for a subsequent part. For example, if a large number of components are being produced in a production environment, the wave metrics can be measured during initial test runs of the parts, and the parts can be tested to determine the wave metrics that correspond to finished parts having acceptable physical properties. Also, testing may be done to determine the effect of variations in cycle parameters (e.g. curing cycle time, oven temperature, and pressure) on the wave metrics and the physical properties of the final parts. This can be utilized to determine acceptable/allowable ranges for the wave metrics such that the process will produce acceptable parts if the measured wave metrics fall within the allowable ranges. The allowable wave metrics may correspond to acceptable ranges for cure variables. However, it will be understood that empirical testing may be conducted to determine allowable wave metrics without determining the cure state (or other variables) corresponding to the allowable wave metrics.

During production, parts may be cured according to baseline cure cycle parameters and the wave metrics can be monitored during the cure cycles of each part. If the measured wave metrics for a particular part indicate that the part is not curing properly according to predefined criteria, the cure cycle parameters can be adjusted during the cure cycle. For example, the cure cycle time, temperature, and/or pressure can be increased from the baseline if the measured wave metrics indicate that the part is curing too slow such that the part is unlikely to achieve a complete cure or to have defects using baseline cure cycle parameters. Conversely, the cure cycle time and/or temperature can be reduced from the baseline if the measured wave metrics indicate that the part is likely to "over cure" or cause defects absent adjustment from the baseline.

Also, if the measured wave metrics show a trend during production, the cure cycle parameters can be adjusted to prevent the measured wave metrics from falling outside the acceptable range. For example, if the measured amplitude of the guided waves at a specified time during a cure cycle is within an allowable range for a series of parts (e.g. part numbers 490-500 of a production run), but the measured amplitude is steadily decreasing for each part 490-500, one or more cure cycle parameters may be adjusted for the next part (e.g. part number 501) to compensate for the trend and increase the measured amplitude of the guided waves. As discussed above, the effects (correlation) between cure cycle parameters and wave metrics (which may be correlated with material cure states and/or properties) may be determined empirically (or utilizing computer modeling). This information can be utilized to determine the required adjustments to the cure cycle parameters to correct the trends in the measured wave metrics.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

All ranges disclosed herein are inclusive of the endpoints, and the endpoints are independently combinable with each other. Each range disclosed herein constitutes a disclosure of any point or sub-range lying within the disclosed range.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." As used herein, the term "and/or" includes any and all combinations of one or more of the associated listed items. As also used herein, the term "combinations thereof" includes combinations having at least one of the associated listed items, wherein the combination can further include additional, like non-listed items. Further, the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

Reference throughout the specification to "another embodiment", "an embodiment", "exemplary embodiments", and so forth, means that a particular element (e.g., feature, structure, and/or characteristic) described in connection with the embodiment is included in at least one embodiment described herein, and can or cannot be present in other embodiments. In addition, it is to be understood that the described elements can be combined in any suitable manner in the various embodiments and are not limited to the specific combination in which they are discussed.

It is to be understood that variations and modifications can be made on the aforementioned structure without departing from the concepts of the present invention, and further it is to be understood that such concepts are intended to be covered by the following claims unless these claims by their language expressly state otherwise.

What is claimed is:

1. A method of in-process cure monitoring of fiber reinforced polymer matrix composite material, the method comprising:

exciting, while a fiber reinforced polymer matrix material is being cured from a liquid state to a state other than the liquid state, one or more vibrational waves into the fiber reinforced polymer matrix material at a first location of the fiber reinforced polymer matrix material using a first piezoelectric transducer as an actuator during curing of the fiber reinforced polymer matrix material, the one or more vibrational waves configured to generate at least a first guided wave and a second guided wave in the fiber reinforced polymer matrix material itself such that that the first guided wave and the second guided wave are internally reflected waves within the fiber reinforced polymer matrix and the first guided wave and the second guided wave have center frequencies that are not equal, and wherein center frequencies of the one or more vibrational waves are within a range from 100 kHz to 350 kHz;

measuring, using a second piezoelectric transducer as a first sensor and while the fiber reinforced polymer matrix material is being cured, at least one frequency dependent wave metric of both the first guided wave and the second guided wave at a second location of the fiber reinforced polymer matrix material that is laterally spaced apart from the first location of the fiber reinforced polymer matrix material a spacing distance that is at least ten times greater than a thickness of the fiber reinforced polymer matrix material;

measuring, using a third piezoelectric transducer as a second sensor and while the fiber reinforced polymer matrix material is being cured, at least one frequency dependent wave metric of both the first guided wave and the second guided wave at a third location of the fiber reinforced polymer matrix material that is spaced apart from both the first location and the second location, and wherein a distance from the first location to the third location is greater than the spacing distance; and utilizing the measured frequency dependent wave metrics to determine a material property of the fiber reinforced polymer matrix material during the curing, wherein the first piezoelectric transducer, the second piezoelectric transducer, and the third piezoelectric transducer are disposed on a plate adjacent to the fiber reinforced polymer matrix material in a curing chamber, wherein at least one of the one or more vibrational waves is excited into the fiber reinforced polymer matrix material during the liquid state of the fiber reinforced polymer matrix material, and wherein the one or more vibrational waves are a Hanning window toneburst of vibrational waves having a center frequency within a range from 100 kHz to 225 kHz.

2. The method of claim 1, further comprising:
utilizing the measured frequency dependent wave metrics to determine a phase transition of the fiber reinforced polymer matrix material.

3. The method of claim 1, wherein:
measuring at least one frequency dependent wave metric of both the first guided wave and the second guided wave includes measuring at least one of:
1) a time of arrival of both the first guided wave and the second guided wave at the second location; and
2) an amplitude of both the first guided wave and the second guided wave at the second location.

4. The method of claim 1, wherein utilizing the measured frequency dependent wave metrics to determine the material property of the fiber reinforced polymer matrix material comprises:
determining a group velocity for the first guided wave and the second guided wave between the second and third locations based at least in part on the measured at least one wave metric of both the first guided wave and the second guided wave at the third location of the fiber reinforced polymer matrix material; and:
utilizing the group velocity to determine the mechanical property of the fiber reinforced polymer matrix material.

5. The method of claim 1, wherein:
the fiber reinforced polymer matrix material comprises a thermosetting polymer;

the curing process includes heating or cooling the fiber reinforced polymer matrix material to a prescribed temperature.

6. The method of claim 1, including:
adjusting at least one parameter of the curing process based, at least in part, on the measured frequency dependent wave metrics.

7. The method of claim 1,
wherein the material property comprises at least one of degree of cure, cure rate, glass transition temperature, modulus, and Poisson ratio,
wherein the curing occurs over a cure period of time, and
wherein the measuring using the second piezoelectric transducer as the first sensor and while the fiber reinforced polymer matrix material is being cured, the measuring using the third piezoelectric transducer as the second sensor and while the fiber reinforced polymer matrix material is being cured, and the utilizing the measured frequency dependent wave metrics to determine the material property of the fiber reinforced polymer matrix material during the curing all iteratively occur throughout the cure period of time.

8. The method of claim 1, wherein:
the measured frequency dependent wave metrics comprise measured wave amplitude of both the first guided wave and the second guided wave at the second location.

9. The method of claim 8, including:
determining a plurality of measured wave amplitudes at a plurality of locations, wherein the plurality of measured wave amplitudes include wave amplitudes of the first guided wave and the second guided wave at the second location and the third location and wherein the plurality of locations includes the second location and third location;
comparing the plurality of measured wave amplitudes to expected wave amplitudes; and:
adjusting at least one parameter of the curing process based on differences between the plurality of measured wave amplitudes and the expected wave amplitudes.

10. The method of claim 9, wherein:
the adjusted parameter is selected from the group consisting of a temperature, pressure, and time at an elevated temperature.

11. The method of claim 1, wherein:
the measured frequency dependent wave metrics comprise times of arrival of both the first guided wave and the second guided wave at the second location; and including:
comparing the measured times of arrival to expected times of arrival to determine differences; and
adjusting at least one curing process parameter based, at least in part on the differences.

12. The method of claim 1, including:
utilizing empirical data to determine a correlation between the measured frequency dependent wave metrics and a cure state of the fiber reinforced polymer matrix material.

13. A method of monitoring a curing process of fiber reinforced composite materials, the method comprising:
forming an uncured composite part comprising fibers disposed in an uncured matrix material:
operably connecting an actuator disposed on a plate to a surface of the uncured composite part at a first location, wherein the actuator is a first piezoelectric transducer;
operably connecting a first sensor disposed on the plate to the surface of the uncured composite part at a second location that is spaced laterally apart from the first location a spacing distance that is at least ten times greater than a thickness of the uncured composite part and wherein the first sensor is a second piezoelectric transducer;

operably connecting a second sensor disposed on the plate to the surface of the uncured composite part at a third location that is spaced apart from both the first location and the second location, and wherein a distance from the first location to the third location is greater than the spacing distance and wherein the second sensor is a third piezoelectric transducer;

causing, while curing the uncured composite part, the actuator to excite vibrational waves into the uncured composite part at the first location, whereby the vibrational waves propagate through the uncured composite part itself due to internal reflection and thereby generate at least a first guided wave and a second guided wave in the uncured composite part, the first guided wave and the second guided wave having different center frequencies, and wherein center frequencies of the excited vibrational waves are within a range from 100 kHz to 225 kHz;

measuring at least one frequency dependent wave metric of both the first guided wave and the second guided wave at the second location utilizing the first sensor and the third location utilizing the second sensor;

performing a curing process on the uncured composite part while exciting the vibrational waves; and adjusting at least one parameter of the curing process before the uncured composite part is fully cured based, at least in part, on the frequency dependent wave metrics measured by the first sensor and the second sensor, wherein a distance from the second location to the third location is different than the spacing distance, and wherein the excited vibrational waves are a Hanning window toneburst of vibrational waves.

14. The method of claim 13, wherein:

adjusting at least one parameter of the curing process includes adjusting at least one parameter selected from the group consisting of a curing temperature, curing pressure, and a curing time.

15. The method of claim 13, wherein:

the frequency dependent wave metrics comprise measured wave times of arrival; and adjusting at least one parameter of the curing process comprises, if the measured wave times of arrival indicate that the uncured composite part is not curing properly according to predefined criteria, adjusting at least one parameter of the curing process.

16. The method of claim 15, wherein:

the uncured matrix material is selected from the group consisting of polymers and ceramics.

17. The method of claim 13, including:

determining wave velocities utilizing the measured frequency dependent wave metrics of the first guided wave and the second guided wave at the second location and the third location.

18. The method of claim 13, wherein the uncured matrix material is in a liquid state during cure.

* * * * *